US012744512B2

(12) United States Patent
Kay et al.

(10) Patent No.: US 12,744,512 B2
(45) Date of Patent: Sep. 22, 2026

(54) METHOD FOR MANUFACTURING A TRANSVERSELY-EXCITED FILM BULK ACOUSTIC RESONATOR (XBAR)

(71) Applicant: Murata Manufacturing Co., Ltd., Nagaokakyo (JP)

(72) Inventors: Andrew Kay, Provo, UT (US); Albert Cardona, Santa Barbara, CA (US); Chris O'Brien, San Diego, CA (US); Akanksha Saha, Santa Barbara, CA (US)

(73) Assignee: Murata Manufacturing Co., Ltd., Nagaokakyo (JP)

( * ) Notice: Subject to any disclaimer, the term of this patent is extended or adjusted under 35 U.S.C. 154(b) by 1088 days.

(21) Appl. No.: 17/878,819

(22) Filed: Aug. 1, 2022

(65) Prior Publication Data

US 2023/0041856 A1 Feb. 9, 2023

Related U.S. Application Data

(60) Provisional application No. 63/228,345, filed on Aug. 2, 2021.

(51) Int. Cl.
*H03H 9/17* (2006.01)
*H03H 3/02* (2006.01)
*H03H 9/13* (2006.01)

(52) U.S. Cl.
CPC .............. *H03H 9/173* (2013.01); *H03H 3/02* (2013.01); *H03H 9/13* (2013.01); *H03H 2003/021* (2013.01)

(58) Field of Classification Search
CPC ............... H03H 2003/021; H03H 3/02; H03H 9/02228; H03H 9/13; H03H 9/173
See application file for complete search history.

(56) References Cited

U.S. PATENT DOCUMENTS 5,204,575 A 4/1993 Kanda et al.
5,274,345 A 12/1993 Gau
(Continued)

FOREIGN PATENT DOCUMENTS

CN 207475507 U * 6/2018
WO 2016017104 2/2016
WO 2018003273 1/2018

OTHER PUBLICATIONS

A. C. Guyette, "Theory and Design of Intrinsically Switched Multiplexers With Optimum Phase Linearity," in IEEE Transactions on Microwave Theory and Techniques, vol. 61, No. 9, pp. 3254-3264, Sep. 2013, doi: 10.1109/ TMTT.2013.2274963. Sep. 2013.
(Continued)

*Primary Examiner* — Minh N Trinh
(74) *Attorney, Agent, or Firm* — ArentFox Schiff LLP

(57) ABSTRACT

A process for fabricating a transversely-excited film bulk acoustic resonator (XBAR) and that XBAR are described. A sacrificial pillar is formed on a surface of a piezoelectric wafer and a highly conforming dielectric layer is deposited on the piezoelectric wafer to bury the sacrificial pillar. The highly conforming dielectric layer is polished to form a planar surface and to leave a thickness of the highly conforming dielectric that covers the sacrificial pillar. The planar surface of the highly conforming dielectric layer is bonded to a surface of a substrate wafer. A conductor pattern is formed on a front surface of the piezoelectric plate and holes are formed through the piezoelectric wafer to the sacrificial pillar. The sacrificial pillar is removed using an etchant introduced through the holes in the piezoelectric wafer to form a cavity under a diaphragm of the piezoelectric wafer spanning the cavity.

15 Claims, 20 Drawing Sheets

(56) References Cited

U.S. PATENT DOCUMENTS 5,446,330 A 8/1995 Eda et al.
5,552,655 A 9/1996 Stokes et al.
5,726,610 A 3/1998 Allen et al.
5,729,186 A 3/1998 Seki et al.
5,853,601 A 12/1998 Krishaswamy
6,172,582 B1 1/2001 Hickernell
6,271,617 B1 8/2001 Yoneda et al.
6,377,140 B1 4/2002 Ehara et al.
6,516,503 B1 2/2003 Ikada et al.
6,540,827 B1 4/2003 Levy et al.
6,570,470 B2 5/2003 Maehara et al.
6,707,229 B1 3/2004 Martin
6,710,514 B2 3/2004 Ikada et al.
6,833,774 B2 12/2004 Abbott et al.
7,009,468 B2 3/2006 Kadota et al.
7,345,400 B2 3/2008 Nakao et al.
7,463,118 B2 12/2008 Jacobsen
7,535,152 B2 5/2009 Ogami et al.
7,684,109 B2 3/2010 Godshalk et al.
7,728,483 B2 6/2010 Tanaka
7,868,519 B2 1/2011 Umeda
7,941,103 B2 5/2011 Iwamoto et al.
7,965,015 B2 6/2011 Tai et al.
8,278,802 B1 10/2012 Lee et al.
8,294,330 B1 10/2012 Abbott et al.
8,344,815 B2 1/2013 Yamanaka et al.
8,816,567 B2 8/2014 Zuo et al.
8,829,766 B2 9/2014 Milyutin et al.
8,932,686 B2 1/2015 Hayakawa et al.
9,093,979 B2 7/2015 Wang
9,112,134 B2 8/2015 Takahashi
9,130,145 B2 9/2015 Martin et al.
9,148,121 B2 9/2015 Inoue
9,219,466 B2 12/2015 Meltaus et al.
9,276,557 B1 3/2016 Nordquist et al.
9,369,105 B1 6/2016 Li et al.
9,425,765 B2 8/2016 Rinaldi
9,525,398 B1 12/2016 Olsson
9,640,750 B2 5/2017 Nakanishi et al.
9,748,923 B2 8/2017 Kando et al.
9,762,202 B2 9/2017 Thalmayr et al.
9,780,759 B2 10/2017 Kimura et al.
9,837,984 B2 12/2017 Khlat et al.
10,079,414 B2 9/2018 Guyette et al.
10,187,039 B2 1/2019 Komatsu et al.
10,200,013 B2 2/2019 Bower et al.
10,211,806 B2 2/2019 Bhattacharjee
10,284,176 B1 5/2019 Solal
10,476,469 B2 11/2019 Gong et al.
10,491,192 B1 11/2019 Plesski et al.
10,601,392 B2 3/2020 Plesski et al.
10,637,438 B2 4/2020 Garcia et al.
10,644,674 B2 5/2020 Takamine
10,756,697 B2 8/2020 Plesski et al.
10,790,802 B2 9/2020 Yantchev et al.
10,797,675 B2 10/2020 Plesski
10,812,048 B2 10/2020 Nosaka
10,819,309 B1 10/2020 Turner et al.
10,826,462 B2 11/2020 Plesski
10,868,510 B2 12/2020 Yantchev et al.
10,868,512 B2 12/2020 Garcia et al.
10,868,513 B2 12/2020 Yantchev
10,911,017 B2 2/2021 Plesski
10,911,021 B2 2/2021 Turner et al.
10,911,023 B2 2/2021 Turner
10,917,070 B2 2/2021 Plesski et al.
10,917,072 B2 2/2021 McHugh et al.
10,985,726 B2 4/2021 Plesski
10,985,728 B2 4/2021 Plesski et al.
10,985,730 B2 4/2021 Garcia
10,992,282 B1 4/2021 Plesski et al.
10,992,283 B2 4/2021 Plesski et al.
10,992,284 B2 4/2021 Yantchev
10,998,877 B2 5/2021 Turner et al.
10,998,882 B2 5/2021 Yantchev et al.
11,003,971 B2 5/2021 Plesski et al.
11,114,996 B2 9/2021 Plesski et al.
11,114,998 B2 9/2021 Garcia et al.
11,139,794 B2 10/2021 Plesski et al.
11,143,561 B2 10/2021 Plesski
11,146,231 B2 10/2021 Plesski
11,146,232 B2 10/2021 Yandrapalli et al.
11,146,238 B2 10/2021 Hammond et al.
11,146,244 B2 10/2021 Yantchev
11,165,407 B2 11/2021 Yantchev
11,171,629 B2 11/2021 Turner
11,201,601 B2 12/2021 Yantchev et al.
11,206,009 B2 12/2021 Plesski
11,228,296 B2 1/2022 Dyer
11,239,816 B1 2/2022 McHugh
11,239,822 B2 2/2022 Garcia
11,264,966 B2 3/2022 Yantchev
11,264,969 B1 3/2022 Fenzi
11,271,539 B1 3/2022 Yantchev
11,271,540 B1 3/2022 Yantchev
11,283,424 B2 3/2022 Turner
11,309,865 B1 4/2022 Guyette
11,323,089 B2 5/2022 Turner
11,323,090 B2 5/2022 Garcia
11,323,091 B2 5/2022 Kay
11,323,095 B2 5/2022 Garcia
11,323,096 B2 5/2022 Yantchev
11,349,450 B2 5/2022 Yantchev
11,349,452 B2 5/2022 Yantchev
11,356,077 B2 6/2022 Garcia
11,368,139 B2 6/2022 Garcia
11,374,549 B2 6/2022 Yantchev
11,381,221 B2 7/2022 McHugh
2002/0079986 A1 6/2002 Ruby et al.
2002/0130736 A1 9/2002 Mukai
2002/0158714 A1 10/2002 Kaitila et al.
2002/0189062 A1 12/2002 Lin et al.
2003/0042998 A1 3/2003 Edmonson
2003/0080831 A1 5/2003 Naumenko et al.
2003/0199105 A1 10/2003 Kub et al.
2004/0041496 A1 3/2004 Imai et al.
2004/0100164 A1 5/2004 Murata
2004/0261250 A1 12/2004 Kadota et al.
2005/0077982 A1 4/2005 Funasaka
2005/0185026 A1 8/2005 Noguchi et al.
2005/0218488 A1 10/2005 Matsuo
2005/0264136 A1 12/2005 Tsutsumi et al.
2006/0152107 A1 7/2006 Tanaka
2006/0179642 A1 8/2006 Kawamura
2007/0182510 A1 8/2007 Park
2007/0188047 A1 8/2007 Tanaka
2007/0194863 A1 8/2007 Shibata et al.
2007/0267942 A1 11/2007 Matsumoto et al.
2008/0246559 A1 10/2008 Ayazi
2010/0019866 A1 1/2010 Hara et al.
2010/0064492 A1 3/2010 Tanaka
2010/0123367 A1 5/2010 Tai et al.
2011/0018389 A1 1/2011 Fukano et al.
2011/0018654 A1 1/2011 Bradley et al.
2011/0109196 A1 5/2011 Goto et al.
2011/0254406 A1 10/2011 Yamane
2011/0278993 A1 11/2011 Iwamoto
2012/0073390 A1 3/2012 Zaghloul et al.
2012/0198672 A1 8/2012 Ueda et al.
2012/0286900 A1 11/2012 Kadota et al.
2012/0326809 A1 12/2012 Tsuda
2013/0127551 A1 5/2013 Yamanaka
2013/0234805 A1 9/2013 Takahashi
2013/0271238 A1 10/2013 Onda
2013/0278609 A1 10/2013 Stephanou et al.
2013/0321100 A1 12/2013 Wang
2014/0130319 A1 5/2014 Iwamoto
2014/0145556 A1 5/2014 Kadota
2014/0151151 A1 6/2014 Reinhardt
2014/0152145 A1 6/2014 Kando et al.
2014/0173862 A1 6/2014 Kando et al.
2014/0225684 A1 8/2014 Kando et al.
2015/0014795 A1 1/2015 Franosch
2015/0042417 A1 2/2015 Onodera et al.

(56) References Cited

U.S. PATENT DOCUMENTS

2015/0165479 A1 6/2015 Lasiter et al.
2015/0319537 A1 11/2015 Perois et al.
2015/0333730 A1 11/2015 Meltaus et al.
2015/0365067 A1 12/2015 Hori et al.
2016/0028367 A1 1/2016 Shealy
2016/0087187 A1 3/2016 Burak
2016/0182009 A1 6/2016 Bhattacharjee
2017/0063332 A1 3/2017 Gilbert et al.
2017/0179225 A1 6/2017 Kishimoto
2017/0179928 A1 6/2017 Raihn et al.
2017/0214381 A1 7/2017 Bhattacharjee
2017/0214387 A1 7/2017 Burak et al.
2017/0222617 A1 8/2017 Mizoguchi
2017/0222622 A1 8/2017 Solal et al.
2017/0228529 A1 8/2017 Huang et al.
2017/0370791 A1 12/2017 Nakamura et al.
2018/0005950 A1 1/2018 Watanabe
2018/0026603 A1 1/2018 Iwamoto
2018/0033952 A1 2/2018 Yamamoto
2018/0041191 A1 2/2018 Park
2018/0062615 A1 3/2018 Kato et al.
2018/0062617 A1 3/2018 Yun et al.
2018/0123016 A1 5/2018 Gong
2018/0191322 A1 7/2018 Chang et al.
2018/0262179 A1 9/2018 Goto
2018/0278227 A1 9/2018 Hurwitz
2018/0309426 A1 10/2018 Guenard
2019/0044498 A1 2/2019 Kawasaki
2019/0068164 A1 2/2019 Houlden et al.
2019/0123721 A1 4/2019 Takamine
2019/0131953 A1 5/2019 Gong
2019/0190487 A1 6/2019 Yasuda
2019/0253038 A1 8/2019 Houlden
2019/0273480 A1 9/2019 Lin et al.
2019/0348966 A1 11/2019 Campanella-Pineda
2019/0379351 A1 12/2019 Miyamoto et al.
2019/0386635 A1 12/2019 Plesski et al.
2019/0386636 A1 12/2019 Plesski et al.
2020/0007110 A1 1/2020 Konaka et al.
2020/0021272 A1 1/2020 Segovia Fernandez et al.
2020/0036357 A1 1/2020 Mimura
2020/0083861 A1 3/2020 Matsuo
2020/0235719 A1 7/2020 Yantchev et al.
2020/0259480 A1 8/2020 Pensala
2020/0274520 A1 8/2020 Shin
2020/0313645 A1 10/2020 Caron
2020/0350891 A1 11/2020 Turner
2021/0013859 A1 1/2021 Turner et al.
2021/0044274 A1 2/2021 Turner et al.
2021/0152154 A1 5/2021 Tang
2021/0265978 A1 8/2021 Plesski et al.
2021/0328574 A1 10/2021 Garcia
2021/0351762 A1 11/2021 Dyer et al.
2023/0041856 A1* 2/2023 Kay ........................ H03H 9/13

OTHER PUBLICATIONS

Acoustic Properties of Solids ONDA Corporation 592 Weddell Drive, Sunnyvale, CA 94089, Apr. 11, 2003, pp. 5 (Year 2003). 2003.

Bahreyni, B. Fabrication and Design of Resonant Microdevices Andrew William, Inc. 2018, NY (Year 2008). 2008.

Bai et al. "The Simulation of Resonant Mode and Effective Electromechanical Coupling Coefficient of Lithium Niobate Crystal with Different Orientations", J. Phys.: Conf. Ser. 1637 012064, 2020 (Year: 2020).

Buchanan "Ceramic Materials for Electronics" 3rd Edition, first published in 2004 by Marcel Dekker, Inc. pp. 496 (Year 2004). Jan. 00, 2004.

Ekeom, D. & Dubus, Bertrand & Volatier, A . . . (2006). Solidly mounted resonator (SMR) FEM-BEM simulation. 1474-1477. 10.1109/ULTSYM.2006.371.

G. Manohar, "Investigation of Various Surface Acoustic Wave Design Configurations for Improved Sensitivity." Doctoral dissertation, University of South Florida, USA, Jan. 2012, 7 pages.

Gnewuch, et al. "Broadband monolithic acousto-optic tunable filter", Mar. 1, 2000 / vol. 25, No. 5 / Optics Letters (Year: 2000).

Kadota et al. "5.4 Ghz Lamb Wave Resonator on LiNbO3 Thin Crystal Plate and Its Application," published in Japanese Journal of Applied Physics 50 (2011) 07HD11. (Year: 2011) 2011.

Kadota et al., "Ultra-Wideband Ladder Filter Using SHO Plate Wave in Thin LiNbO3 Plate and Its Application to Tunable Filter", IEEE Transactions on Ultrasonics, Ferroelectrics, and Frequency Control, vol. 62, No. 5, May 2015, pp. 939-946 (Year: 2015).

Lin et al., "A novel weighted method for layered SAW filters using slanted finger interdigital transducers", J. Phys. D: Appl. Phys. 39 (2006) pp. 466-470 (Year: 2006).

M. Kadota et al.; "Ultrawide Band Ladder Filter using SH0 plate Wave in Thin LiNb03 Plate and its Application"; 2014 EEE International Ultrasonics Symposium Proceedings, 2014, pp. 2031-2034. (Year: 2014).

M. Kadota, S. Tanaka, "Wideband acoustic wave resonators composed of hetero acoustic layer structure," Japanese Journal of Applied Physics, vol. 57, No. 7S1. Published Jun. 5, 2018. 5 pages.

M.-H. Li et al.; "Temperature Stability Analysis of Thin-Film Lithium Niobate SH0 Plate Wave Resonators"; Journal of Microelectromechanical Systems, vol. 28, No. 5, Oct. 2019, pp. 799-809. (Year: 2019).

Material Properties of Tibtech Innovations, © 2018 TIBTECH Innovations (Year 2018). 2018.

Merriam Webster, dictionary meaning of the word "diaphragm", since 1828, Merriam Webster (Year: 1828) 1828.

Mizutaui, K. and Toda, K., "Analysis of lamb wave propagation characteristics in rotated Ycut Xpropagation LiNbO3 plates." Electron. Comm. Jpn. Pt. 1, 69, No. 4 (1986): 47-55. doi:10.1002/ecja.4410690406.

Moussa et al. Review on Triggered Liposomal Drug Delivery with a Focus on Ultrasound 2015, Bentham Science Publishers, pp. 16 (Year 2005) 2005.

Namdeo et al. "Simulation on Effects of Electrical Loading due to Interdigital Transducers in Surface Acoustic Wave Resonator", published in Procedia Engineering 64 ( 2013) of Science Direct pp. 322-330 (Year: 2013) 2013.

Naumenko et al., "Optimal orientations of Lithium Niobate for resonator SAW filters", 2003 IEEE Ultrasonics Symposium—pp. 2110-2113. (Year: 2003).

R. Olsson III, K. Hattar et al. "A high electromechanical coupling coefficient SH0 Lamb wave lithiumniobate micromechanical resonator and a method for fabrication" Sensors and Actuators A: Physical, vol. 209, Mar. 1, 2014, pp. 183-190.

Reinhardt, "Acoustic filters based on thin single crystal LiNbQ,3 films: status and prospects", 2014 IEEE International Ultrasonics Symposium Proceedings, pp. 773-781 (Year: 2014).

Rodriguez-Madrid et al., "Super-High-Frequency SAW Resonators on AIN/Diamond", IEEE Electron Device Letters, vol. 33, No. 4, Apr. 2012, pp. 495-497. Year: 2012) 2012.

Safari et al. "Piezoelectric for Transducer Applications" published by Elsevier Science Ltd., pp. 4 (Year: 2000). 2020.

Santosh, G. , Surface acoustic wave devices on silicon using patterned and thin film ZnO, Ph.D. thesis, Feb. 2016, Indian Institute of technology Guwahati, Assam, India Feb. 2016.

Sinha et al., "Slanted finger Inter-digital Transducers for the design of improved performance small shape factor mid-bandwidth SAW filters", IEEE MTT-S International Microwave and RF Conference, 2013. (Year: 2013).

Sorokin et al. Study of Microwave Acoustic Attenuation in a Multi-frequency Bulk Acoustic Resonator Based on a Synthetic Diamond Single Crystal Published in Acoustical Physics, vol. 61, No. 6, 2015 pp. 675 (Year 2015) Jan. 00, 2015.

T. Takai, H. Iwamoto, et al., "I.H.P.Saw Technology and its Application to Microacoustic Components (Invited)." 2017 IEEE International Ultrasonics Symposium, Sep. 6-9, 2017. pp. 1-8.

USPTO/ISA, International Search Report and Written Opinion for PCT Application No. PCT/US2019/036433 dated Aug. 29, 2019.

USPTO/ISA, International Search Report and Written Opinion for PCT Application No. PCT/US2019/058632 dated Jan. 17, 2020.

(56) References Cited

OTHER PUBLICATIONS

USPTO/ISA, International Search Report and Written Opinion for PCT Application No. PCT/US2020/45654 dated Oct. 29, 2020.
USPTO/ISA, International Search Report and Written Opinion for PCT Application No. PCT/US2021/024824 dated Jul. 27, 2021, 9 total pages.
USPTO/ISA, International Search Report and Written Opinion for PCT Application No. PCT/US2021/048505 dated Dec. 1, 2021, 11 total pages.
Wu et al., "Frequency band-gap measurement of two-dimensional air/silicon phononic crystals using layered slanted finger interdigital transducers", J. Appl. Phys. 97, 094916, 2005 (Year: 2005).
Y. Yang, A. Gao et al. "5 GHZ Lithium Niobate MEMS Resonators With High FOM of 153", 2017 IEEE 30th International Conference in Micro Electro Mechanical Systems (MEMS). Jan. 22-26, 2017. pp. 942-945.
Y. Yang, R. Lu et al. "Towards Ka Band Acoustics: Lithium Niobat Asymmetrical Mode Piezoelectric MEMS Resonators", Department of Electrical and Computer Engineering University of Illinois at Urbana-Champaign, May 2018. pp. 1-2.
Yanson Yang, Ruochen Lu, Songbin Gong, High Q Antisymmetric Mode Lithium Niobate MEMS Resonators With Spurious Mitigation, Journal of Microelectromechanical Systems, vol. 29, No. 2, Apr. 2020. Apr. 2, 2020.
Yu-Po Wong, Luyan Qiu, Naoto Matsuoka, Ken-ya Hashimoto, Broadband Piston Mode Operation for First-order Antisymmetric Mode Resonators, 2020 IEEE International Ultrasonics Symposium, Sep. 2020. Sep. 2020.
Zou, Jie "High-Performance Aluminum Nitride Lamb Wave Resonators for RF Front-End Technology" University of California, Berkeley, Summer 2015, pp. 63 (Year 2015) Jan. 00, 2015.

* cited by examiner

METHOD FOR MANUFACTURING A TRANSVERSELY-EXCITED FILM BULK ACOUSTIC RESONATOR (XBAR)

A portion of the disclosure of this patent document contains material which is subject to copyright protection. This patent document may show and/or describe matter which is or may become trade dress of the owner. The copyright and trade dress owner has no objection to the facsimile reproduction by anyone of the patent disclosure as it appears in the Patent and Trademark Office patent files or records, but otherwise reserves all copyright and trade dress rights whatsoever.

RELATED APPLICATION INFORMATION

This patent claims priority to co-pending U.S. provisional patent application No. 63/228,345, titled FRONTSIDE MEMBRANE RELEASE, filed Aug. 2, 2021.

BACKGROUND

Field

This disclosure relates to radio frequency filters using acoustic wave resonators, and specifically to filters for use in communications equipment.

Description of the Related Art

A radio frequency (RF) filter is a two-port device configured to pass some frequencies and to stop other frequencies, where "pass" means transmit with relatively low signal loss and "stop" means block or substantially attenuate. The range of frequencies passed by a filter is referred to as the "pass-band" of the filter. The range of frequencies stopped by such a filter is referred to as the "stop-band" of the filter. A typical RF filter has at least one pass-band and at least one stop-band. Specific requirements on a passband or stop-band depend on the specific application. For example, a "pass-band" may be defined as a frequency range where the insertion loss of a filter is better than a defined value such as 1 dB, 2 dB, or 3 dB. A "stop-band" may be defined as a frequency range where the rejection of a filter is greater than a defined value such as 20 dB, 30 dB, 40 dB, or greater depending on application.

RF filters are used in communications systems where information is transmitted over wireless links. For example, RF filters may be found in the RF front-ends of cellular base stations, mobile telephone and computing devices, satellite transceivers and ground stations, IoT (Internet of Things) devices, laptop computers and tablets, fixed point radio links, and other communications systems. RF filters are also used in radar and electronic and information warfare systems.

RF filters typically require many design trade-offs to achieve, for each specific application, the best compromise between performance parameters such as insertion loss, rejection, isolation, power handling, linearity, size and cost. Specific design and manufacturing methods and enhancements can benefit simultaneously one or several of these requirements.

Performance enhancements to the RF filters in a wireless system can have broad impact to system performance. Improvements in RF filters can be leveraged to provide system performance improvements such as larger cell size, longer battery life, higher data rates, greater network capacity, lower cost, enhanced security, higher reliability, etc. These improvements can be realized at many levels of the wireless system both separately and in combination, for example at the RF module, RF transceiver, mobile or fixed sub-system, or network levels.

High performance RF filters for present communication systems commonly incorporate acoustic wave resonators including surface acoustic wave (SAW) resonators, bulk acoustic wave (BAW) resonators, film bulk acoustic wave resonators (FBAR), and other types of acoustic resonators. However, these existing technologies are not well-suited for use at the higher frequencies and bandwidths proposed for future communications networks.

The desire for wider communication channel bandwidths will inevitably lead to the use of higher frequency communications bands. Radio access technology for mobile telephone networks has been standardized by the 3GPP ($3^{rd}$ Generation Partnership Project). Radio access technology for $5^{th}$ generation mobile networks is defined in the 5G NR (new radio) standard. The 5G NR standard defines several new communications bands. Two of these new communications bands are n77, which uses the frequency range from 1300 MHz to 4200 MHz, and n79, which uses the frequency range from 4400 MHz to 5000 MHz. Both band n77 and band n79 use time-division duplexing (TDD), such that a communications device operating in band n77 and/or band n79 use the same frequencies for both uplink and downlink transmissions. Bandpass filters for bands n77 and n79 must be capable of handling the transmit power of the communications device. WiFi bands at 5 GHz and 6 GHz also require high frequency and wide bandwidth. The 5G NR standard also defines millimeter wave communication bands with frequencies between 24.25 GHz and 40 GHz.

The Transversely-Excited Film Bulk Acoustic Resonator (XBAR) is an acoustic resonator structure for use in microwave filters. The XBAR is described in U.S. Pat. No. 10,491,291, titled TRANSVERSELY EXCITED FILM BULK ACOUSTIC RESONATOR. An XBAR resonator comprises an interdigital transducer (IDT) formed on a thin floating layer, or diaphragm, of a single-crystal piezoelectric material. The IDT includes a first set of parallel fingers, extending from a first busbar and a second set of parallel fingers extending from a second busbar. The first and second sets of parallel fingers are interleaved. A microwave signal applied to the IDT excites a shear primary acoustic wave in the piezoelectric diaphragm. XBAR resonators provide very high electromechanical coupling and high frequency capability. XBAR resonators may be used in a variety of RF filters including band-reject filters, band-pass filters, duplexers, and multiplexers. XBARs are well suited for use in filters for communications bands with frequencies above 3 GHz.

Figure 1:
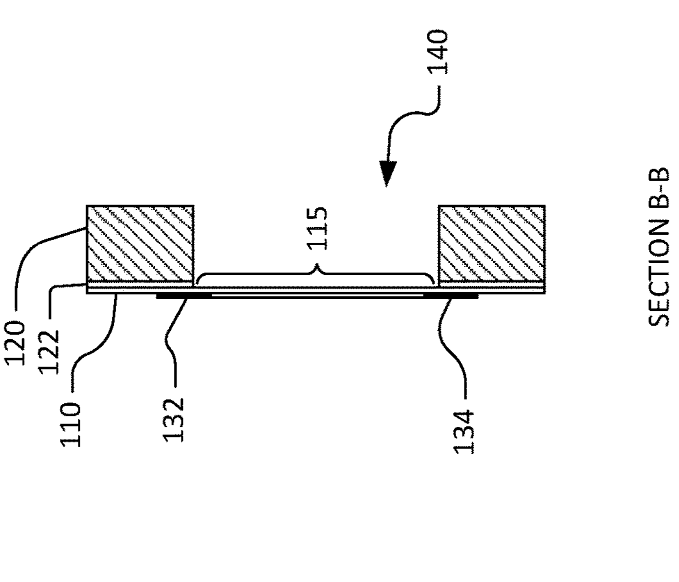
FIG. 1 includes a schematic plan view and two schematic cross-sectional views of a transversely-excited film bulk acoustic resonator (XBAR).
Figure 1:
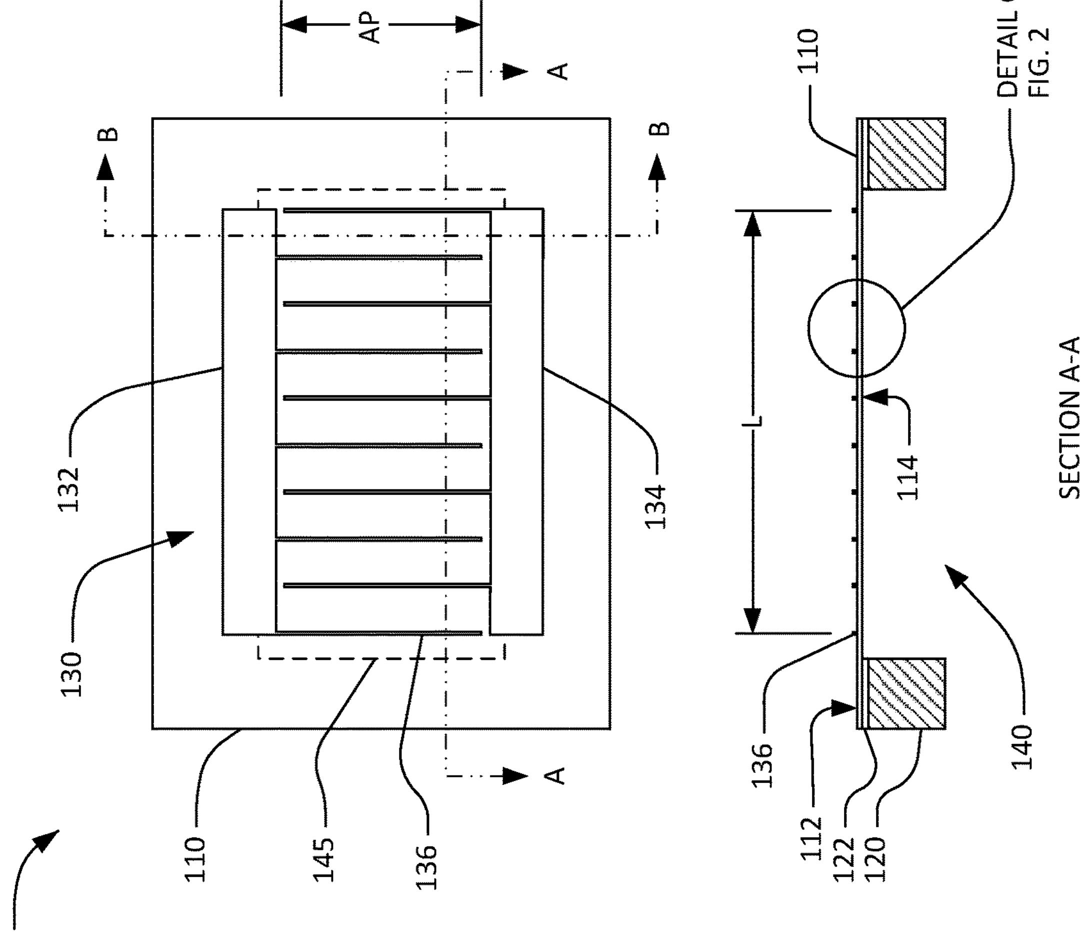

Throughout this description, elements appearing in figures are assigned three-digit or four-digit reference designators, where the two least significant digits are specific to the element and the one or two most significant digit is the figure number where the element is first introduced. An element that is not described in conjunction with a figure may be presumed to have the same characteristics and function as a previously-described element having the same reference designator or the same two least significant digits.

DETAILED DESCRIPTION

Description of Apparatus

The Transversely-Excited Film Bulk Acoustic Resonator (XBAR) is a new resonator structure for use in microwave filters. The XBAR is described in U.S. Pat. No. 10,491,291, titled TRANSVERSELY EXCITED FILM BULK ACOUSTIC RESONATOR, which is incorporated herein by reference in its entirety. An XBAR resonator comprises a conductor pattern having an interdigital transducer (IDT) formed on a thin floating layer or diaphragm of a piezoelectric material. The IDT has two busbars which are each attached to a set of fingers and the two sets of fingers are interleaved on the diaphragm over a cavity formed in a substrate upon which the resonator is mounted. The diaphragm spans the cavity and may include front-side and/or back-side dielectric layers. A microwave signal applied to the IDT excites a shear primary acoustic wave in the piezoelectric diaphragm, such that the acoustic energy flows substantially normal to the surfaces of the layer, which is orthogonal or transverse to the direction of the electric field generated by the IDT. XBAR resonators provide very high electromechanical coupling and high frequency capability.

A piezoelectric membrane may be a part of a plate of single-crystal piezoelectric material that spans a cavity in the substrate. A piezoelectric diaphragm may be the membrane and may include the front-side and/or back-side dielectric layers. An XBAR resonator may be such a diaphragm or membrane with an interdigital transducer (IDT) formed on the diaphragm or membrane. Contact pads can be formed at selected locations over the surface of the substrate to provide electrical connections between the IDT and contact bumps to be attached to or formed on the contact pads.

Currently XBAR fabrication processes may be divided into two broad categories known as "the front-side etch option" or front-side membrane release (FSMR) process, and the "backside etch option" or backside membrane release (BSMR) process. With the front-side etch option, the piezoelectric plate is attached to a substrate and the diaphragm portion of the piezoelectric plate floats over a cavity (the "swimming pool") formed by etching away a tub (e.g., a thickness of an area like a bathtub) of the substrate or a sacrificial material using an etchant introduced through holes in the piezoelectric plate to form the cavity. With the backside etch option, the piezoelectric plate is attached to a substrate and the diaphragm portion of the piezoelectric plate floats over a cavity etched through the substrate and possibly a sacrificial tub from the back side (i.e. the side of the substrate that is opposite the piezoelectric plate).

The following describes improved XBAR resonators, filters and fabrication techniques using sacrificial pillars on a piezoelectric plate, such as accomplished by forming a highly conforming dielectric on a sacrificial pillar of a piezoelectric plate, polishing the highly conforming dielectric, and flip chip bonding the highly conforming dielectric to a substrate (or a bonding oxide layer (BOX) of the substrate). The sacrificial pillars on a piezoelectric plate may be part of a FSMR process that provides a lower cost, more controllable approach for XBAR devices as compared to technique without a pillar on the plate, with a pillar on the substrate or using a BSMR process.

Polishing the dielectric may leave a thickness of the dielectric that covers the pillar so that the dielectric has a homogenous surface for bonding to the substrate or oxide layer of the substrate. Using the homogenous bonding surface makes it easier to polish the highly conforming dielectric since only that material is being polished which avoids inconsistent or non-uniform polishing when polishing the different materials of the highly conforming dielectric and sacrificial pillar material.

Using the homogenous bonding surface makes it easier to bond the highly conforming dielectric to the substrate since only that material is being bonded to the substrate which avoids inconsistent or non-uniform bonding when bonding the different materials of the highly conforming dielectric and sacrificial pillar material to the substrate. Using the homogenous bonding surface makes it easier to polish and bond patterned wafers, such as a patterned piezoelectric wafer and or patterned silicon wafer. Using the homogenous bonding surface allows good bonding to the substrate with or without a substrate oxide layer to bond to the plate wafer.

FIG. 1 shows a simplified schematic top view and orthogonal cross-sectional views of a transversely-excited film bulk acoustic resonator (XBAR) 100. XBAR resonators such as the resonator 100 may be used in a variety of RF filters including band-reject filters, band-pass filters, duplexers, and multiplexers. XBARs are particularly suited for use in filters for communications bands with frequencies above 3 GHz.

The XBAR 100 is made up of a thin film conductor pattern formed on a surface of a piezoelectric plate 110 having parallel front and back surfaces 112, 114, respectively. The piezoelectric plate is a thin single-crystal layer of a piezoelectric material such as lithium niobate, lithium tantalate, lanthanum gallium silicate, gallium nitride, or aluminum nitride. The piezoelectric plate is cut such that the orientation of the X, Y, and Z crystalline axes with respect to the front and back surfaces is known and consistent. The piezoelectric plate may be Z-cut (which is to say the Z axis is normal to the front and back surfaces 112, 114), rotated Z-cut, or rotated YX cut. XBARs may be fabricated on piezoelectric plates with other crystallographic orientations.

The back surface 114 of the piezoelectric plate 110 is attached to a substrate 120 that provides mechanical support to the piezoelectric plate 110. The substrate 120 may be, for example, silicon, sapphire, quartz, or some other material. The substrate may have layers of silicon thermal oxide (TOX) and crystalline silicon. The substrate may be or include a thermally formed SiO2, sputter formed SiO2 and/or plasma-enhanced chemical vapor deposition (PECVD) formed SiO2. The back surface 114 of the piezoelectric plate 110 may be bonded to the substrate 120 using a wafer bonding process, or grown on the substrate 120, or attached to the substrate in some other manner. The piezoelectric plate is attached directly to the substrate or may be attached to the substrate via a bonding oxide layer 122, such as a bonding oxide (BOX) layer of SiO2, or another oxide such as Al2O3.

As shown in FIG. 1, the diaphragm 115 is contiguous with the rest of the piezoelectric plate 110 around all of a perimeter 145 of the cavity 1. In this context, "contiguous" means "continuously connected without any intervening item". However, it is possible for a bonding oxide layer (BOX) to bond the plate 110 to the substrate 120. The BOX layer may exist between the plate and substrate around perimeter 145 and may extend further away from the cavity than just within the perimeter itself. In the absence of a process to remove it (i.e., this invention) the BOX is everywhere between the piezoelectric plate and the substrate. The BOX is typically removed from the back of the diaphragm 115 as part of forming the cavity.

The conductor pattern of the XBAR 100 includes an interdigital transducer (IDT) 130. The IDT 130 includes a first plurality of parallel fingers, such as finger 136, extending from a first busbar 132 and a second plurality of fingers extending from a second busbar 134. The first and second pluralities of parallel fingers are interleaved. The interleaved fingers 136 overlap for a distance AP, commonly referred to as the "aperture" of the IDT. The center-to-center distance L between the outermost fingers of the IDT 130 is the "length" of the IDT.

The first and second busbars 132, 134 serve as the terminals or electrodes of the XBAR 100. A radio frequency or microwave signal applied between the two busbars 132, 134 of the IDT 130 excites a primary acoustic mode within the piezoelectric plate 110. As will be discussed in further detail, the excited primary acoustic mode is a bulk shear mode where acoustic energy propagates along a direction substantially orthogonal to the surface of the piezoelectric plate 110, which is also normal, or transverse, to the direction of the electric field created by the IDT fingers. Thus, the XBAR is considered a transversely-excited film bulk wave resonator.

A cavity 140 is formed in the substrate 120 such that a portion 115 of the piezoelectric plate 110 containing the IDT 130 is suspended over the cavity 140 without contacting the substrate 120 or the bottom of the cavity. "Cavity" has its conventional meaning of "an empty space within a solid body." The cavity may contain a gas, air, or a vacuum. In some case, there is also a second substrate, package or other material having a cavity (not shown) above the plate 110, which may be a mirror image of substrate 120 and cavity 140. The cavity above plate 110 may have an empty space depth greater than that of cavity 140. The fingers extend over (and part of the busbars may optionally extend over) the cavity (or between the cavities). The cavity 140 may be a hole completely through the substrate 120 (as shown in Section A-A and Section B-B of FIG. 1) or a recess in the substrate 120 (as shown subsequently in FIG. 3A). The cavity 140 may be formed, for example, by selective etching of the substrate 120 before or after the piezoelectric plate 110 and the substrate 120 are attached. As shown in FIG. 1, the cavity 140 has a rectangular shape with an extent greater than the aperture AP and length L of the IDT 130. A cavity of an XBAR may have a different shape, such as a regular or irregular polygon. The cavity of an XBAR may more or fewer than four sides, which may be straight or curved.

The portion 115 of the piezoelectric plate suspended over the cavity 140 will be referred to herein as the "diaphragm" (for lack of a better term) due to its physical resemblance to the diaphragm of a microphone. The diaphragm may be continuously and seamlessly connected to the rest of the piezoelectric plate 110 around all, or nearly all, of perimeter of the cavity 140. In this context, "contiguous" means "continuously connected without any intervening item". In some cases, a BOX layer may bond the plate 110 to the substrate 120 around the perimeter.

For ease of presentation in FIG. 1, the geometric pitch and width of the IDT fingers is greatly exaggerated with respect to the length (dimension L) and aperture (dimension AP) of the XBAR. A typical XBAR has more than ten parallel fingers in the IDT 110. An XBAR may have hundreds, possibly thousands, of parallel fingers in the IDT 110. Similarly, the thickness of the fingers in the cross-sectional views is greatly exaggerated.

Figure 2:
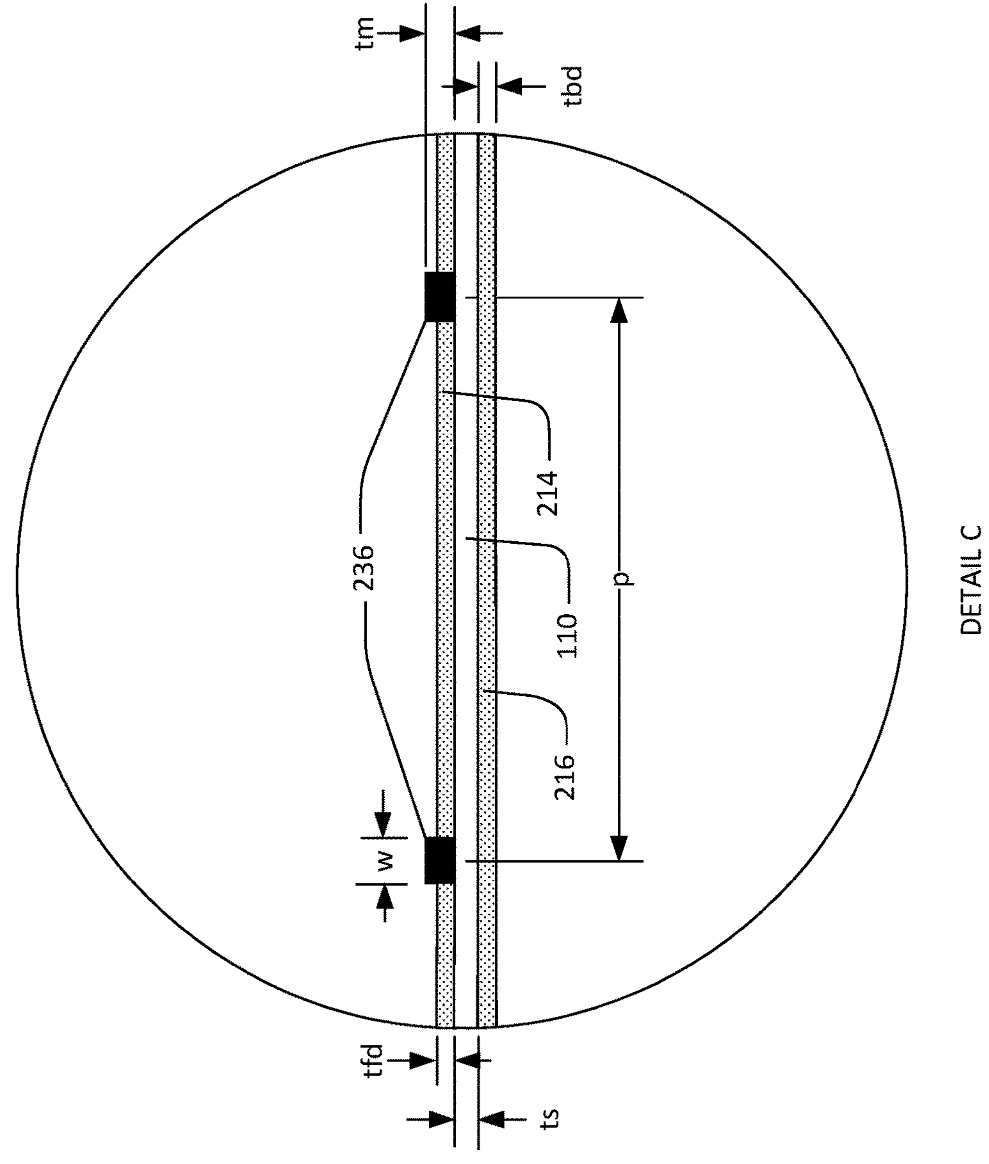
FIG. 2 is an expanded schematic cross-sectional view of a portion of the XBAR of FIG. 1.
Figure 2:
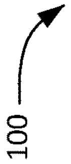

FIG. 2 shows a detailed schematic cross-sectional view of the XBAR 100 of FIG. 1. The cross-sectional view may be a portion of the XBAR 100 that includes fingers of the IDT. The piezoelectric plate 110 is a single-crystal layer of piezoelectrical material having a thickness ts. The ts may be, for example, 100 nm to 1500 nm. When used in filters for LTE™ bands from 3.4 GHZ to 6 GHz (e.g., bands 42, 43, 46), the thickness ts may be, for example, 200 nm to 1000 nm.

A front-side dielectric layer 214 may optionally be formed on the front side of the piezoelectric plate 110. The "front side" of the XBAR or plate is, by definition, the surface facing away from the substrate. The front-side dielectric layer 214 has a thickness tfd. The front-side dielectric layer 214 is formed between the IDT fingers 236. Although not shown in FIG. 2, the front side dielectric layer 214 may also be deposited over the IDT fingers 236. A back-side dielectric layer 216 may optionally be formed on the back side of the piezoelectric plate 110. The "back side" of the XBAR or plate is, by definition, the surface facing towards from the substrate. The back-side dielectric layer may be or include the BOX layer. The back-side dielectric layer 216 has a thickness tbd. The front-side and back-side dielectric layers 214, 216 may be a non-piezoelectric dielectric material, such as silicon dioxide or silicon nitride. The tfd and tbd may be, for example, 0 to 500 nm. tfd and tbd are typically less than the thickness ts of the piezoelectric plate. The tfd and tbd are not necessarily equal, and the front-side and back-side dielectric layers 214, 216 are not necessarily the same material. Either or both of the front-side and back-side dielectric layers 214, 216 may be formed of multiple layers of two or more materials.

The front side dielectric layer 214 may be formed over the IDTs of some (e.g., selected ones) of the XBAR devices in a filter. The front side dielectric 214 may be formed between and cover the IDT finger of some XBAR devices but not be formed on other XBAR devices. For example, a front side frequency-setting dielectric layer may be formed over the IDTs of shunt resonators to lower the resonance frequencies of the shunt resonators with respect to the resonance frequencies of series resonators, which have thinner or no front side dielectric. Some filters may include two or more different thicknesses of front side dielectric over various resonators. The resonance frequency of the resonators can be set thus "tuning" the resonator, at least in part, by selecting a thicknesses of the front side dielectric.

Further, a passivation layer may be formed over the entire surface of the XBAR device 100 except for contact pads where electric connections are made to circuitry external to the XBAR device. The passivation layer is a thin dielectric layer intended to seal and protect the surfaces of the XBAR device while the XBAR device is incorporated into a package. The front side dielectric layer and/or the passivation layer may be, $SiO_2$, $Si_3N_4$, $Al_2O_3$, some other dielectric material, or a combination of these materials.

The thickness of the passivation layer may be selected to protect the piezoelectric plate and the metal conductors from water and chemical corrosion, particularly for power durability purposes. It may range from 10 to 100 nm. The passivation material may consist of multiple oxide and/or nitride coatings such as SiO2 and Si3N4 material.

The IDT fingers 236 may be one or more layers of aluminum or a substantially aluminum alloy, copper or a substantially copper alloy, beryllium, tungsten, molybdenum, gold, or some other conductive material. Thin (relative to the total thickness of the conductors) layers of other metals, such as chromium or titanium, may be formed under and/or over the fingers to improve adhesion between the fingers and the piezoelectric plate 110 and/or to passivate or encapsulate the fingers. The busbars (132, 134 in FIG. 1) of the IDT may be made of the same or different materials as the fingers.

Dimension p is the center-to-center spacing or "pitch" of the IDT fingers, which may be referred to as the pitch of the IDT and/or the pitch of the XBAR. Dimension w is the width or "mark" of the IDT fingers. The IDT of an XBAR differs substantially from the IDTs used in surface acoustic wave (SAW) resonators. In a SAW resonator, the pitch of the IDT is one-half of the acoustic wavelength at the resonance frequency. Additionally, the mark-to-pitch ratio of a SAW resonator IDT is typically close to 0.5 (i.e. the mark or finger width is about one-fourth of the acoustic wavelength at resonance). In an XBAR, the pitch p of the IDT is typically 2 to 20 times the width w of the fingers. In addition, the pitch p of the IDT is typically 2 to 20 times the thickness is of the piezoelectric slab 212. The width of the IDT fingers in an XBAR is not constrained to one-fourth of the acoustic wavelength at resonance. For example, the width of XBAR IDT fingers may be 500 nm or greater, such that the IDT can be fabricated using optical lithography. The thickness tm of the IDT fingers may be from 100 nm to about equal to the width w. The thickness of the busbars (132, 134 in FIG. 1) of the IDT may be the same as, or greater than, the thickness tm of the IDT fingers.

Figure 3A:
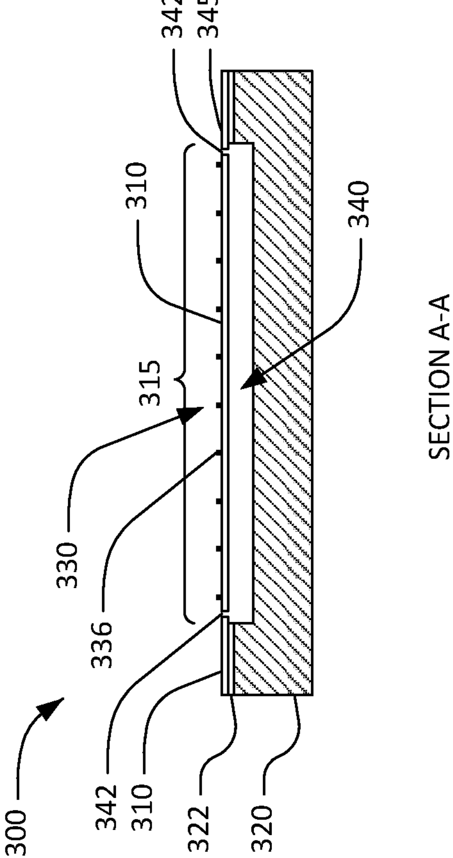
FIG. 3A is an alternative schematic cross-sectional view of an XBAR.

FIG. 3A is an alternative cross-sectional view of XBAR device 300 along the section plane A-A defined in FIG. 1. In FIG. 3A, a piezoelectric plate 310 is attached to a substrate 320. A portion of the piezoelectric plate 310 forms a diaphragm 315 spanning a cavity 340 in the substrate. The cavity 340, does not fully penetrate the substrate 320, and is formed in the substrate under the portion of the piezoelectric plate 310 containing the IDT 330 of a conductor pattern (e.g., first metal or M1 layer) of an XBAR. Fingers, such as finger 336, of IDT 330 are disposed on the diaphragm 315. Interconnection of the IDT (e.g., busbars) 330 to signal and ground paths may be through a second conductor pattern (e.g., M2 metal layer, not shown in FIG. 3) to electrical contacts on a package.

Plate 310, diaphragm 315 and fingers 336 may be plate 110, diaphragm 115 and fingers 136. The cavity 340 may be formed, for example, by etching the substrate 320 before attaching the piezoelectric plate 310. Alternatively, the cavity 340 may be formed by etching the substrate 320 with a selective etchant that reaches the substrate through one or more openings 342 provided in the piezoelectric plate 310. The diaphragm 315 may be contiguous with the rest of the piezoelectric plate 310 around a large portion of a perimeter 345 of the cavity 340. For example, the diaphragm 315 may be contiguous with the rest of the piezoelectric plate 310 around at least 50% of the perimeter of the cavity 340.

One or more intermediate material layers 322 may be attached between plate 310 and substrate 320. An intermediary layer may be or include a bonding layer, a BOX layer, an etch stop layer, a sealing layer, an adhesive layer or layer of other material that is attached or bonded to plate 310 and substrate 320. Layers 322 may be one or more of any of these layers or a combination of these layers.

While the cavity 340 is shown in cross-section, it should be understood that the lateral extent of the cavity is a continuous closed band area of substrate 320 that surrounds and defines the size of the cavity 340 in the direction normal to the plane of the drawing. The lateral (i.e. left-right as shown in the figure) extent of the cavity 340 is defined by the lateral edges substrate 320. The vertical (i.e., down from plate 310 as shown in the figure) extent or depth of the cavity 340 into substrate 320. In this case, the cavity 340 has a side cross-section rectangular, or nearly rectangular, cross section.

The XBAR 300 shown in FIG. 3A will be referred to herein as a "front-side etch" configuration since the cavity 340 is etched from the front side of the substrate 320 (before or after attaching the piezoelectric plate 310). The XBAR 100 of FIG. 1 will be referred to herein as a "back-side etch" configuration since the cavity 140 is etched from the back side of the substrate 120 after attaching the piezoelectric plate 110. The XBAR 300 shows one or more openings 342 in the piezoelectric plate 310 at the left and right sides of the cavity 340. However, in some cases openings 342 in the piezoelectric plate 310 are only at the left or right side of the cavity 340.

Figure 3B:
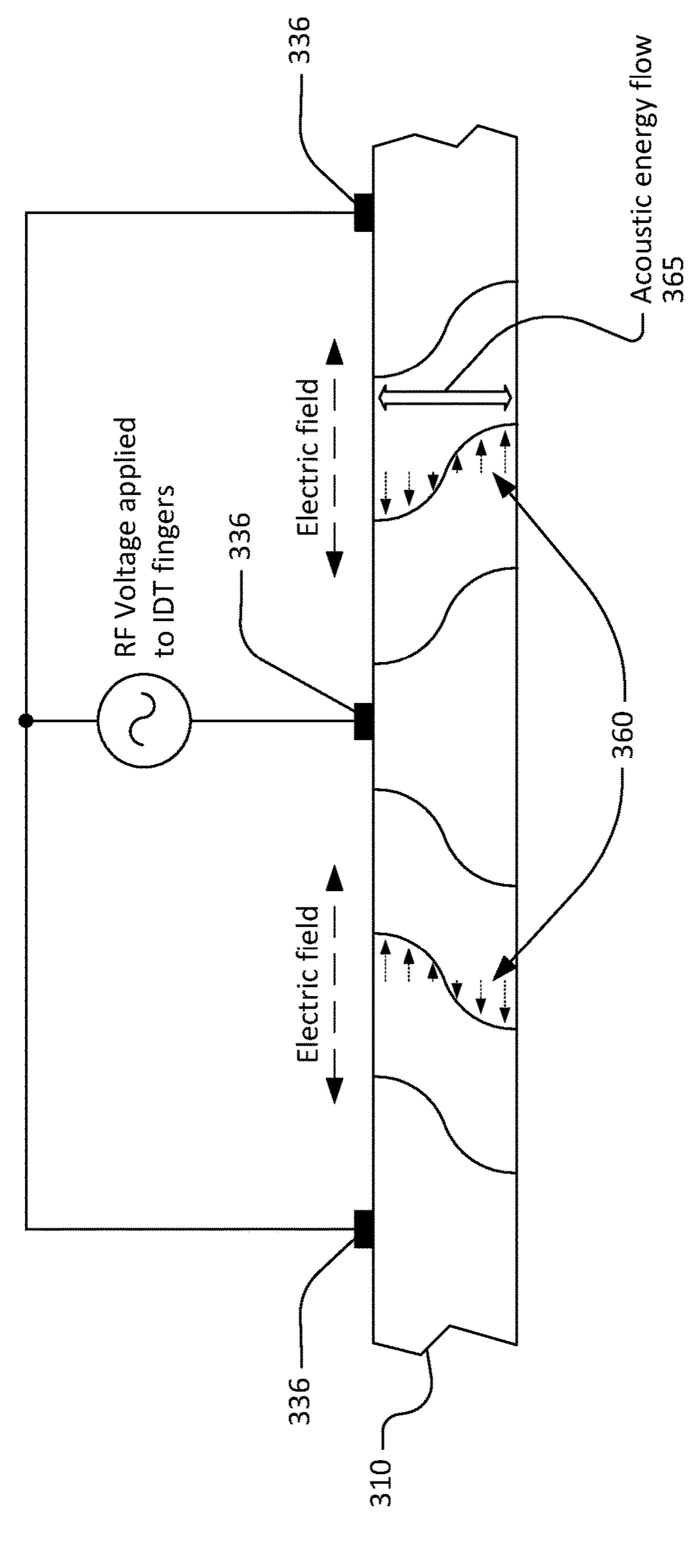
FIG. 3B is a graphical illustration of the primary acoustic mode of interest in an XBAR.

FIG. 3B is a graphical illustration of the primary acoustic mode of interest in an XBAR. FIG. 3B shows a small portion of an XBAR 350 including a piezoelectric plate 310 and three interleaved IDT fingers 336. XBAR 350 may be part of any XBAR herein. An RF voltage is applied to the interleaved fingers 336. This voltage creates a time-varying electric field between the fingers. The direction of the electric field is primarily lateral, or parallel to the surface of the piezoelectric plate 310, as indicated by the arrows labeled "electric field". Due to the high dielectric constant of the piezoelectric plate, the electric field is highly concentrated in the plate relative to the air. The lateral electric field introduces shear deformation, and thus strongly excites a primary shear-mode acoustic mode, in the piezoelectric plate 310. In this context, "shear deformation" is defined as deformation in which parallel planes in a material remain parallel and maintain a constant distance while translating relative to each other. A "shear acoustic mode" is defined as an acoustic vibration mode in a medium that results in shear deformation of the medium. The shear deformations in the XBAR 350 are represented by the curves 360, with the adjacent small arrows providing a schematic indication of the direction and magnitude of atomic motion. The degree of atomic motion, as well as the thickness of the piezoelectric plate 310, have been greatly exaggerated for ease of visualization. While the atomic motions are predominantly lateral (i.e. horizontal as shown in FIG. 3B), the direction of acoustic energy flow of the excited primary shear acoustic mode is substantially orthogonal to the front and back surface of the piezoelectric plate, as indicated by the arrow 365.

An acoustic resonator based on shear acoustic wave resonances can achieve better performance than current state-of-the art film-bulk-acoustic-resonators (FBAR) and solidly-mounted-resonator bulk-acoustic-wave (SMR BAW) devices where the electric field is applied in the thickness direction. The piezoelectric coupling for shear wave XBAR resonances can be high (>20%) compared to other acoustic resonators. High piezoelectric coupling enables the design and implementation of microwave and millimeter-wave filters with appreciable bandwidth.

Figure 4:
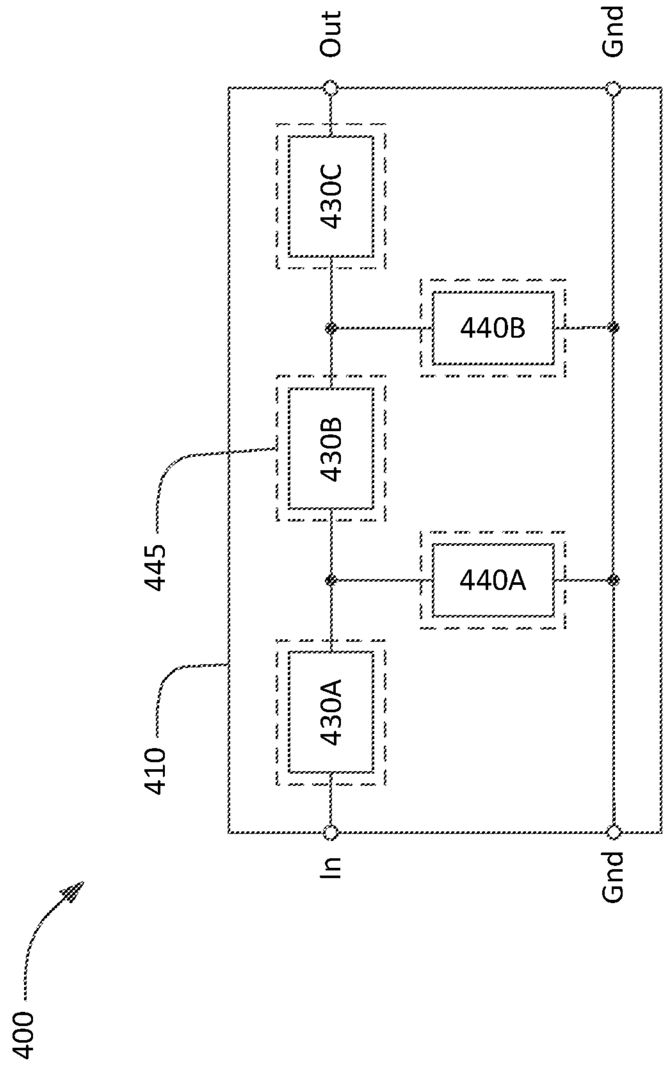
FIG. 4 is a schematic circuit diagram and layout for a high frequency band-pass filter using XBARs.

FIG. 4 is a schematic circuit diagram and layout for a high frequency band-pass filter 400 using XBARs. The filter 400 has a conventional ladder filter architecture including three series resonators 430A, 430B, 430C and two shunt resonators 440A, 440B. The three series resonators 430A, 430B, and 430C are connected in series between a first port and a second port. In FIG. 4, the first and second ports are labeled "In" and "Out", respectively. However, the filter 400 is bidirectional and either port and serve as the input or output of the filter. The two shunt resonators 440A, 440B are connected from nodes between the series resonators to ground. All the shunt resonators and series resonators are XBARs on a single die. All or most of the resonators of FIG. 4 are XBAR resonators as noted herein.

The three series resonators 430A, B, C and the two shunt resonators 440A, B of the filter 400 may be formed on a single plate 410 of piezoelectric material bonded to a silicon substrate (not visible). Alternatively, as will be described in further detail, the series resonators and the shunt resonators may be formed on separate plate of piezoelectric material. Each resonator includes a respective IDT (not shown), with at least the fingers of the IDT disposed over a cavity in the substrate. In this and similar contexts, the term "respective" means "relating things each to each", which is to say with a one-to-one correspondence. In FIG. 4, the cavities are illustrated schematically as the dashed rectangles (such as the rectangle 445). In this example, each IDT is disposed over a respective cavity. In other filters, the IDTs of two or more resonators may be disposed over a single cavity.

Description of Methods

Figure 5A:
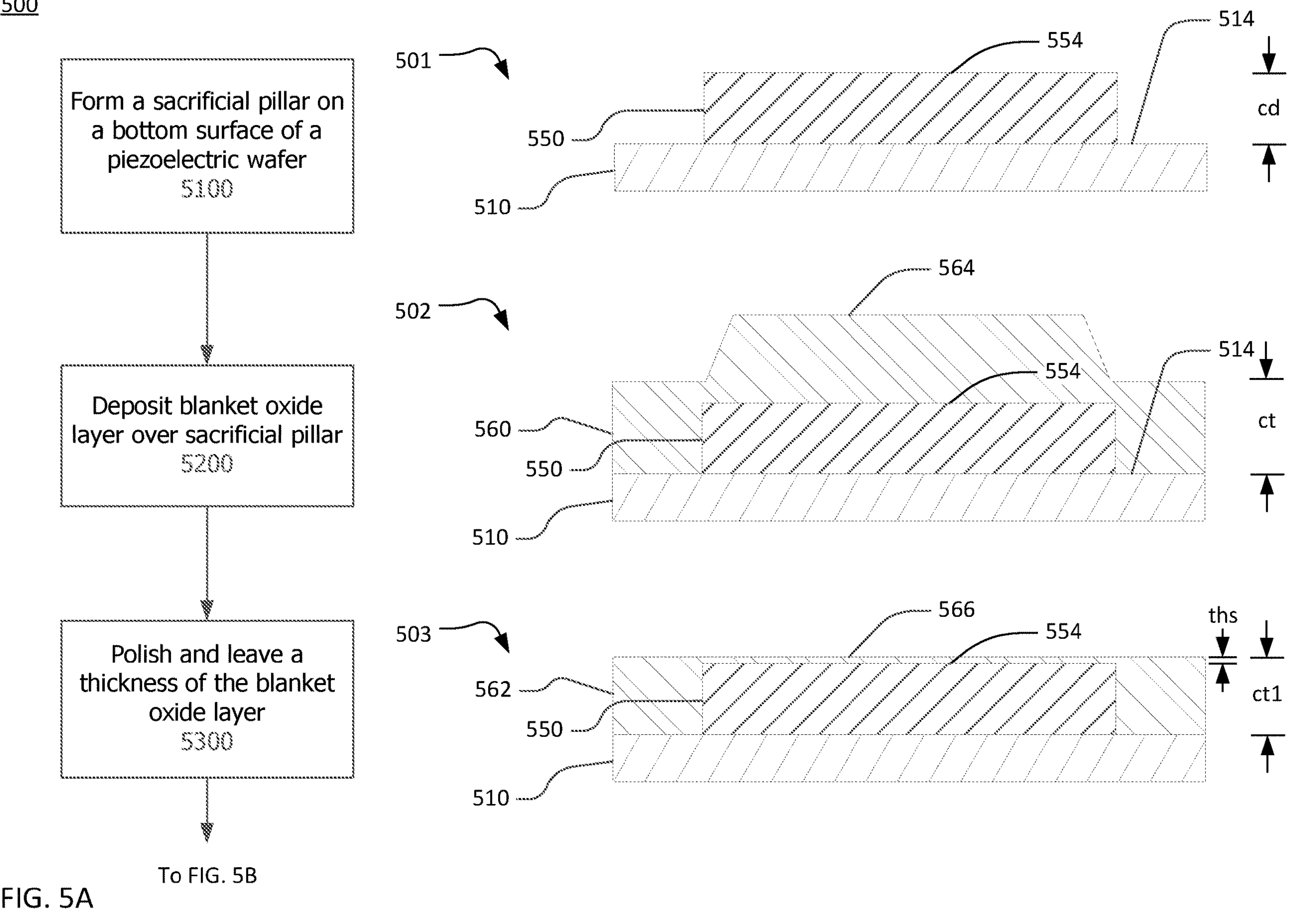
FIGS. 5A, 5B and 5C are a flow chart of a process for fabricating an XBAR resonator using a sacrificial pillar on a piezoelectric plate and/or using a homogenous bonding surface.
Figure 5B:
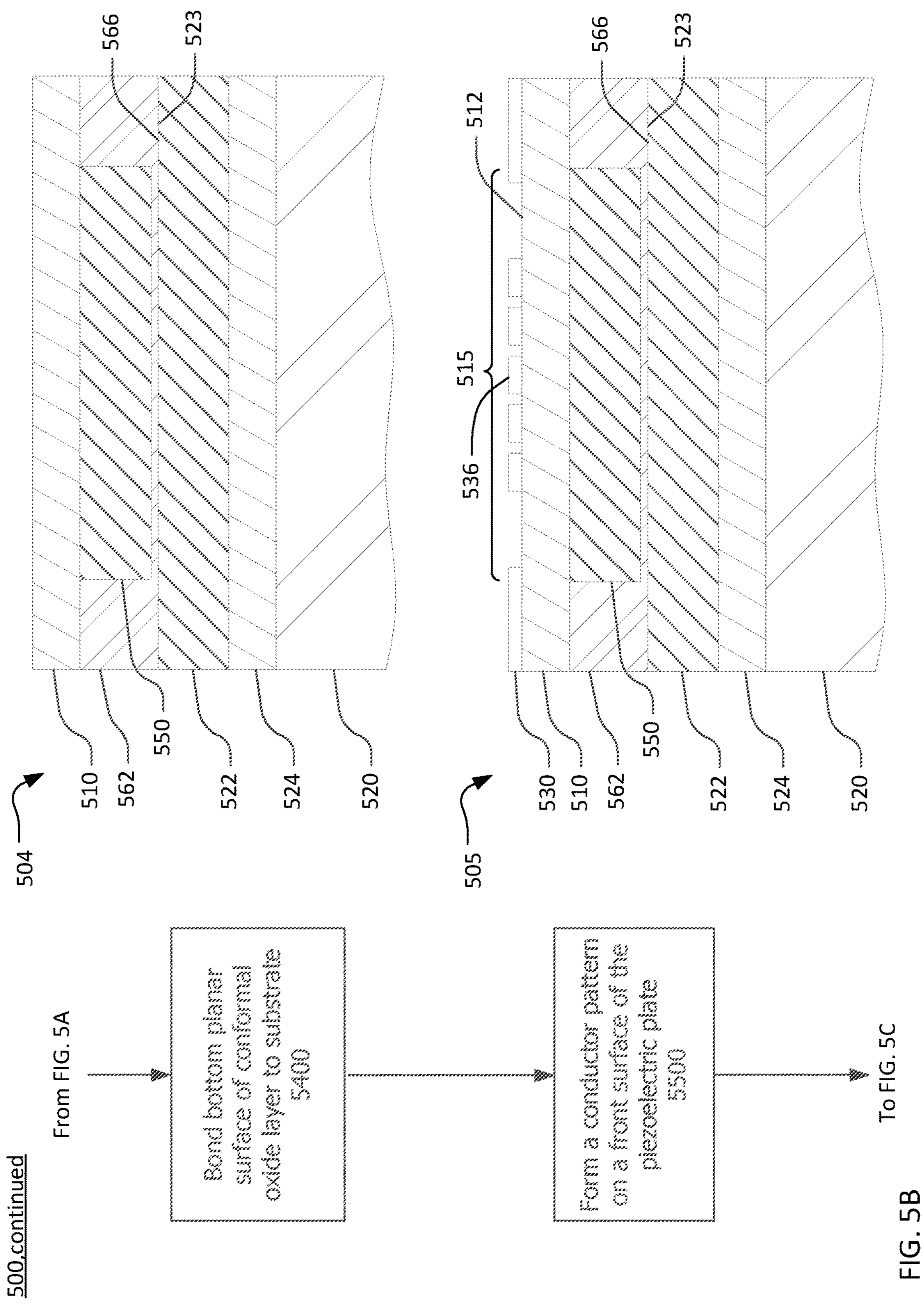
Figure 5C:
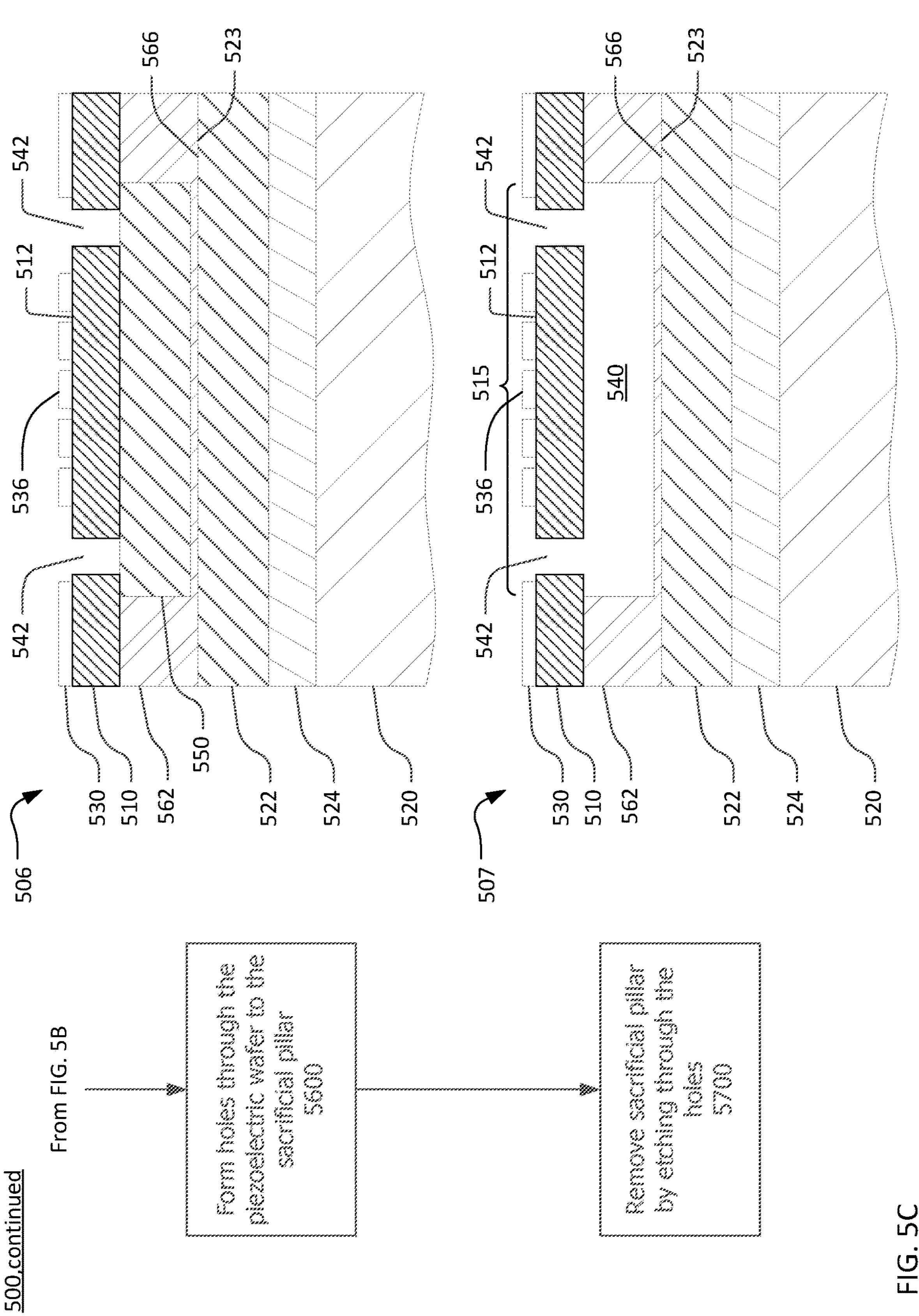

FIGS. 5A, 5B and 5C are collectively a flow chart of a process 500 for fabricating an XBAR resonator using a sacrificial pillar on a piezoelectric plate and/or using a homogenous bonding surface. The process 500 may be the forming of or may be included in the forming of resonator 100 or 300. The process 500 starts at step 5100 and ends at step 5700 with a completed XBAR RF resonator 507. The process 500 may be a resonator buildup process.

Each of the flow charts of FIGS. 5-9 include only major process steps. Various conventional process steps (e.g. surface preparation, chemical mechanical processing (CMP), cleaning, inspection, deposition, photolithography, baking, annealing, monitoring, testing, etc.) may be performed before, between, after, and during the steps shown in FIGS. 5-9.

At 5100, a sacrificial pillar 550 is formed on a bottom surface 514 of a piezoelectric wafer 510 to form device 501. Sacrificial pillar 550 has a thickness cd on a bottom surface 514 of a piezoelectric wafer 510. Thickness cd may be the same distance as a depth for a cavity of an XBAR, such as a depth of cavity 140 or 340.

Step 5100 may include forming the pillar 550 by depositing a blanket layer of pillar material on the bottom surface 514 of the piezoelectric wafer 510; then optionally polishing the blanket layer of pillar material; then masking and patterning the top of the blanket layer of (polished) pillar material; and etching through the pattern to remove areas of the blanket layer pillar material to the piezoelectric wafer to leave the pillar 550. The piezoelectric wafer may be used as an etch stop for the etching through the pattern to remove areas of the blanket layer pillar material.

At 5200, a blanket dielectric layer 560 is deposited over sacrificial pillar 550 to form device 502. Step 5200 may be depositing a blanket highly conformal dielectric layer 560 on the bottom surface 514 of the piezoelectric wafer and on the bottom surface 554 of the sacrificial pillar to bury the sacrificial pillar 550, which is to say completely covering and sealing around the pillar 550 so that no part of the pillar is exposed though the layer 560.

Layer 560 has a thickness ct above the surface 514 and over surface 554. Thickness ct is greater than thickness cd and may become a thickness ct1 forming a planar surface 566 after polishing surface 564 and/or thickness ct to thickness ct1 at step 5300.

At 5300, the blanket dielectric layer 560 is polished and a thickness ths of the blanket dielectric layer 562 is left over the sacrificial pillar 550 to form device 503. Step 5300 may be polishing a surface 564 of the blanket highly conforming dielectric layer 560 to form a planar surface 566 of the highly conforming dielectric layer 562 and to leave a thickness ths of the highly conforming dielectric that covers the sacrificial pillar surface 554. Surface 566 is a homogenous surface for bonding to a substrate 520 or BOX layer 522 of a substrate. Polishing at 5300 may be planarizing the exposed surface 564 by CMP or another process that does not polish to expose or polish into the pillar 550.

At 5400, the planar surface 566 of conformal dielectric layer 564 is bonded to a substrate 520 to form device 504. Step 5400 may be bonding the planar surface 566 to a planar front or top surface 523 of the substrate wafer 520. Bonding at 5400 may be flip chip bonding a wafer having device 503 to a wafer having substrate 520, such as by inverting the wafer having the plate 503 and bonding it upside down to the substrate wafer 520. At 5400, bonding may be flip chip bonding the planar surface 566 of the highly conforming dielectric layer to a bonding oxide (BOX) layer 522 of the substrate, the BOX layer on a trap rich layer 524 of the substrate wafer 520.

Bonding at 5400 may be forming a bond between surfaces 566 and 523 by an adhesive, chemical, covalent, atomic, and/or electron bond. Bonding at 5400 may be an adhesive bond, direct or fusion bonding, such as including plasma or wet surface activation bond. The boning mechanism may be a combination of Van der Waals and covalent bonds.

Step 5400 may include, prior to bonding, forming the trap rich top layer 524 on (or as part of) the substrate wafer 520; and forming the BOX layer 522 on the trap rich layer (or as part of substrate wafer 520). Step 5400 may include, prior to or after forming the bond, thinning the piezoelectric wafer to form a piezoelectric plate having a target piezoelectric membrane thickness. The plate or wafer may be referred to as either plate or wafer in further processing descriptions.

In some cases, the piezoelectric plate 510 is lithium niobate or lithium tantalate. The piezoelectric plate 510 may be a piezoelectric wafer of material noted for plate 110 and/or 310.

In some cases, the sacrificial pillar 550 is polycrystalline silicon, a silicon oxide, SiO2, an amorphous Silicon, a silicon nitride, or Si2N3. In some cases, the sacrificial pillar 550 is polycrystalline and/or a silicon material. It may be an amorphous silicon.

In some cases, the highly conforming dielectric layer 560 and 562 is one of phosphosilicate glass (PSG), silicon oxide, SiO2, silicon nitride, or Si2N3. In some cases, they are SiO2 varieties, such as SiO2 of phosphosilicate glass (PSG), borosilicate glass (BSG), borophosphosilicate glass (BPSG), Spun on glass (SOG), and undoped SiO2. Although undoped SiO2 tends to have much lower conformance, it can be used as a very thick layer.

In some cases, the BOX layer 522 is one of polycrystalline silicon, silicon oxide, SiO2, silicon nitride or Si2N3.

In some cases, the trap rich layer 524 may be a layer on or as part of the (e.g., silicon) wafer 520. The trap-rich layer 524 has an abundance of traps that capture free carriers and reduce carrier lifetime to an extent that the conductivity of the trap-rich layer 524 approaches zero. It may be amorphous silicon or polycrystalline silicon.

A trap-region layer 524 may be formed on a silicon wafer 520 by depositing a layer of trap-rich material such as amorphous silicon or polysilicon (polycrystalline silicon). When the trap-rich layer is polysilicon, the average grain size of the polysilicon should be substantially smaller than the minimum spacing between IDT fingers 536. The thickness of the trap rich region formed on or within a high resistivity silicon substrate should be greater than the thickness of an inversion layer that may form in the absence of the trap-rich layer.

In some cases, the substrate wafer 520 is one of silicon, sapphire, quartz, glass, Diamond, SiC, and/or AlN.

In some cases, a thickness ths of the polished highly conforming dielectric layer 562 above the pillar 550 is between 10 nm and 10 um. Also, thickness ths may be between 100 nm and 1 um.

In some cases, a thickness cd of the sacrificial pillar is between 50 nm and 50 um. It may be between 0.5 um and 15 um. The sacrificial pillar may be between 0.2 nm and 7 um thick. It may have a thickness cd is as noted for cavity 140 and/or 340.

At 5500, a conductor pattern which includes an interdigital transducer (IDT) 530 is formed on the front surface 512 of piezoelectric plate 510 to form device 505. The pattern and IDT 530 may be similar to the pattern and IDT 130 of FIG. 1, and/or the pattern and IDT 330 of FIG. 3.

A portion 515 of the piezoelectric plate 510 containing the IDT 530 is formed and located above pillar 550 so that when cavity 540 is formed at 5700 by etching the pillar, portion 515 will form a diaphragm 515 that spans the cavity 540.

Step 5500 may include forming the at least one conductor pattern including IDT 5300 with interleaved fingers disposed on the diaphragm 515 spanning the location for cavity 5400. The piezoelectric plate 510 and the IDT 530 are configured such that radio frequency signals applied to the IDT excites a primary shear acoustic mode in the piezoelectric plate over the formed cavity 540.

Forming the conductor pattern at 5500 may be a deposition and etching process, such as depositing or electro plating a blanket deposition of a layer of the material, masking of the deposited layer, patterning the mask, then etching away the deposited layer through the mask to form the conductor pattern and IDT. The piezoelectric wafer may be used as an etch stop for the etching through the pattern to remove areas of the metal layer to form the conductor pattern at 5500. Forming the conductor pattern at 5500 may include depositing and patterning a photoresist layer, a blanket deposition of the (e.g., metal) material of the layer, and removal of the photoresist to lift off the overlying material to leave the conductor pattern on the plate.

The conductive layer and/or IDT 530 may be one or more layers of aluminum or a substantially aluminum alloy, copper or a substantially copper alloy, beryllium, tungsten, molybdenum, gold, chromium, titanium, or some other conductive material such as noted for layers 130 and 330. The IDT may be copper, aluminum or a combination thereof.

At 5600, holes 542 are formed through the piezoelectric wafer 510 to the sacrificial pillar 550 to form device 506. Step 5600 may be forming holes 542 through the front surface 512 and the back surface 514 of the piezoelectric wafer 510, and into the sacrificial pillar 550.

Forming the holes 542 may an etching process, such as masking of the plate 510, patterning the mask, then etching away the plate 510 through the mask to form the holes 542. The pillar 550 may be used as an etch stop for the etching through the pattern to remove areas of the plate 510 to form the holes 542 at 5600. Forming the holes 542 may include piezoelectric (e.g., LN) wafer ion trimming and/or ion milling of the front surface 512 of the plate 510. Ion milling may include a physical etching technique whereby the ions of an inert gas (typically Ar) are accelerated from a wide beam ion source into the surface 512 of a plate 510 in vacuum in order to remove material to some desired depth or underlayer, such as to the pillar 550. Holes 542 may be formed by masking plate 510, forming a pattern of the mask and etching, ion trimming and/or ion milling the plate 510 (and optionally conductor pattern having IDT 530) through the openings in the mask.

At 5700, the sacrificial pillar 550 is removed by etching through the holes 542 to form device 507. Step 5700 may be removing the sacrificial pillar 550 using an etchant introduced through the holes 542 in the piezoelectric wafer 510 to form a cavity 540 under a diaphragm 515 of the piezoelectric wafer 510 spanning the cavity 540. Diaphragm 515 may be a portion of the piezoelectric plate 510 containing the IDT 530 and that spans the cavity 540. Forming the cavity 540 at 5700 may use an etching process, such as etching away the pillar 550 material through the holes 542 using the material of plate 510 and layer 562 as an etch stop for the etching to form the cavity 540.

Step 5700 may include removing pillar 550 using a front-side etching of the pillar 550 through the holes 542 to form the cavity 540 where the pillar 550 is removed in a frontside release (FSMR) of a piezoelectric membrane of the plate 510 to form the diaphragm 515 over the etched cavity 540.

In some cases, the sacrificial pillar 550 is a pillar material that can be selectively etched with respect to the material of the highly conforming dielectric layer 562 and the material of the piezoelectric plate 510. In some cases, the sacrificial pillar 550 is a pillar material that can be selectively etched with respect to the material of plate 510.

When the plate 510 material is an LN or LT PZ layer, etch selectivity to LN or LT for the material of pillar 550 may be >10,000:1, such as where the etchant chemical is XeF2 or VHF. Other etchants in this case may be a wet etch of HF. Another etchant in this case may be SF6/KOH, and/or Phosphoric. Some examples include plate 510 being a PZ layer and the etch being:

| Sacrificial Material 550 or 850 | Etch Stop 562, 762 or 824 | Example Etchant |
|---|---|---|
| Si based (amorphous, polysilicon) | SiO2 | XeF2, SF6, KOH |

-continued

| Sacrificial Material 550 or 850 | Etch Stop 562, 762 or 824 | Example Etchant |
|---|---|---|
| SiO2 | Si | vapor HF, HF, BOE |
| Si | SiN | SF6, KOH |
| SiO2 | SiN | vapor HF, HF, BOE |
| Si, SiO2, Sin | Sapphire/Al203 layer | Any of these etchants above |
| SiN | Si or SiO2 | Phosphoric |

In some cases, the highly conforming dielectric layer is phosphosilicate glass (PSG) glass, Diamond, SiC, or AN; the sacrificial pillar is polycrystalline silicon or an amorphous Silicon; the bonding layer is SiO2; the at least one conductor pattern is metal; the piezoelectric plate is lithium niobate; and the etchant to remove the pillar is FS6.

Process 500 and/or removing the sacrificial pillar at 5700 may be part of a FSMR process that provides a lower cost, more controllable approach for XBAR devices as compared to a technique without a pillar 550 on the plate 510, with a pillar formed directly on the substrate 520 or using a BSMR process. Process 500 and/or removing the sacrificial pillar at 5700 may provide a more accurate lateral etch and vertical cavity wall etch of the cavity 540 than not using pillar 550 formed on the plate 510 and/or not using conforming layer 560/562 over the pillar.

Process 500 and/or polishing the dielectric to leave thickness the of the dielectric 562 that covers the pillar at 5300 forms a homogenous surface 566 of the material of layer 562 for bonding to the substrate 520 or oxide layer 522 of the substrate makes it easier to polish the highly conforming dielectric 560 since only the material of layer 560 is being polished which avoids inconsistent or non-uniform polishing when polishing the different materials of the highly conforming dielectric 560 and sacrificial pillar material 550. In other words, not polishing to pillar 550 more easily forms planar surface 566 of only layer 562 instead of also polishing pillar 550 which may create inconsistencies in the polished planar surface 566 of only layer 562.

Using the homogenous bonding surface 566 makes it easier to bond the highly conforming dielectric 562 to the substrate (e.g., layer 520 or 522) since only the material of layer 562 is being bonded to the substrate which avoids inconsistent or non-uniform bonding, such as if bonding the different materials of the highly conforming dielectric 562 and to the buried sacrificial pillar material 550 to the substrate. Using the homogenous bonding surface 566 can allow good bonding to the substrate 520 or layer 524 with or without a substrate oxide layer 522 to bond to the plate wafer.

In some cases, for process 500, the substrate 520 is a high resistivity, a polycrystalline or a crystalline silicon (Si) material having a thickness of 150-500 um; the pillar 550 is polysilicon or amorphous silicon with a thickness of between 0.5 or 0.2 and 7 um thick; the conformal layer 562 is PSG and has a thickness of between 2 and 8 um thick; the BOX layer 522 has a thickness of between 3 and 5 um; and the trap rich layer 524 is an oxide layer or trap rich polysilicon layer having a thickness of between 0.3 and 1 um; the IDT 530 is metal such as titanium aluminum; and the piezoelectric plate 510 is one of lithium niobate or lithium tantalate having a thickness of between 150 and 1000 nm.

In some cases, device 507 is an acoustic resonator having a piezoelectric plate 510, a portion of the piezoelectric plate spanning a cavity 540 in a conformal dielectric layer 562 bonded to a substrate 520. The dielectric layer 562 has a polished and homogenous bottom surface 566 of dielectric forming the bond to a planar surface 523 of a bonding oxide (BOX) layer 522 of the substrate. An interdigital transducer 530 is on a surface of the piezoelectric plate 510, with interleaved fingers 536 of the IDT on the portion of the piezoelectric plate that spans the cavity. Holes 542 extend through the piezoelectric plate 510 to the cavity 540.

Figure 6A:
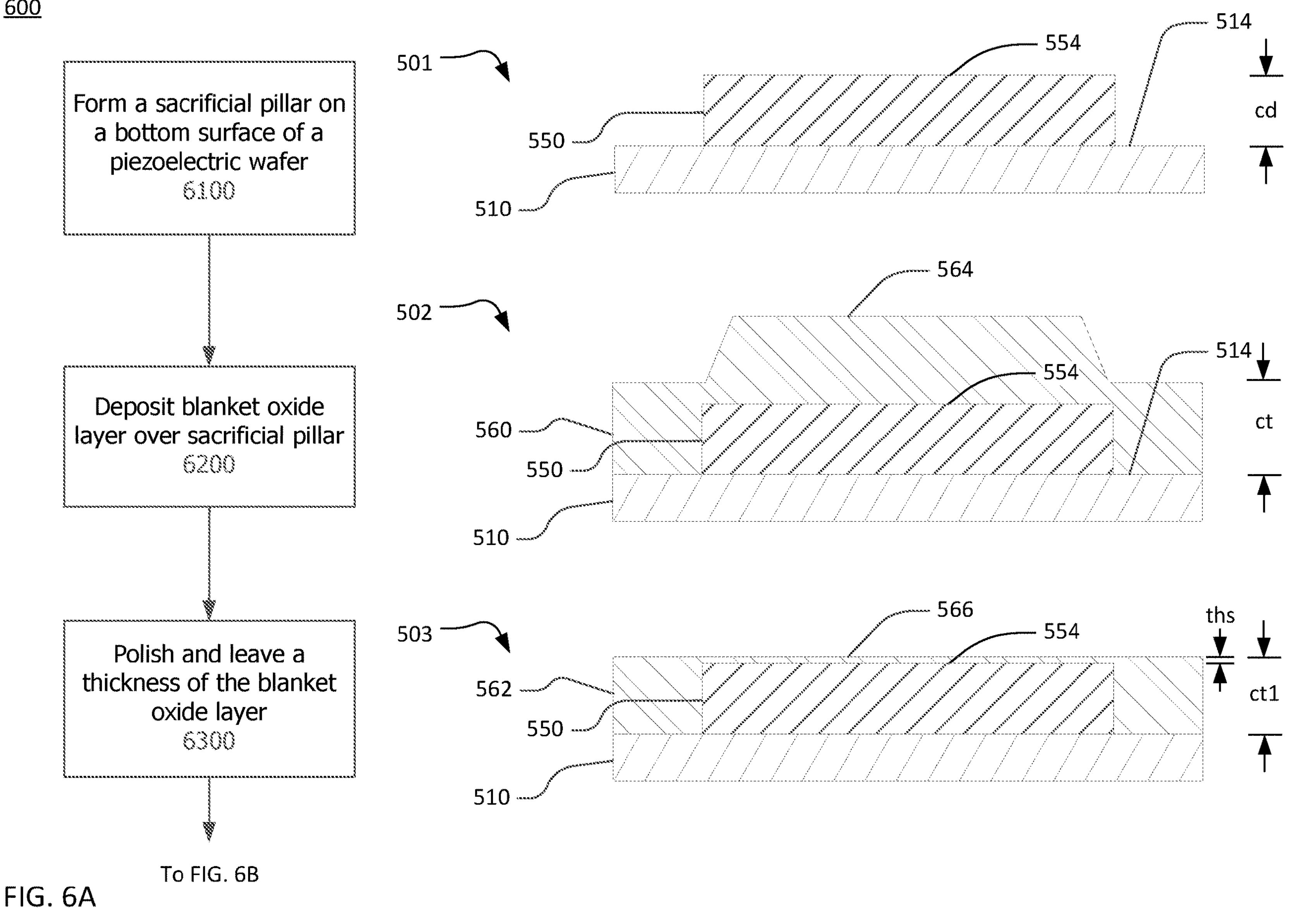
FIGS. 6A, 6B and 6C are a flow chart of a process for fabricating an XBAR resonator using a sacrificial pillar on a piezoelectric plate and/or using a homogenous bonding surface.
Figure 6B:
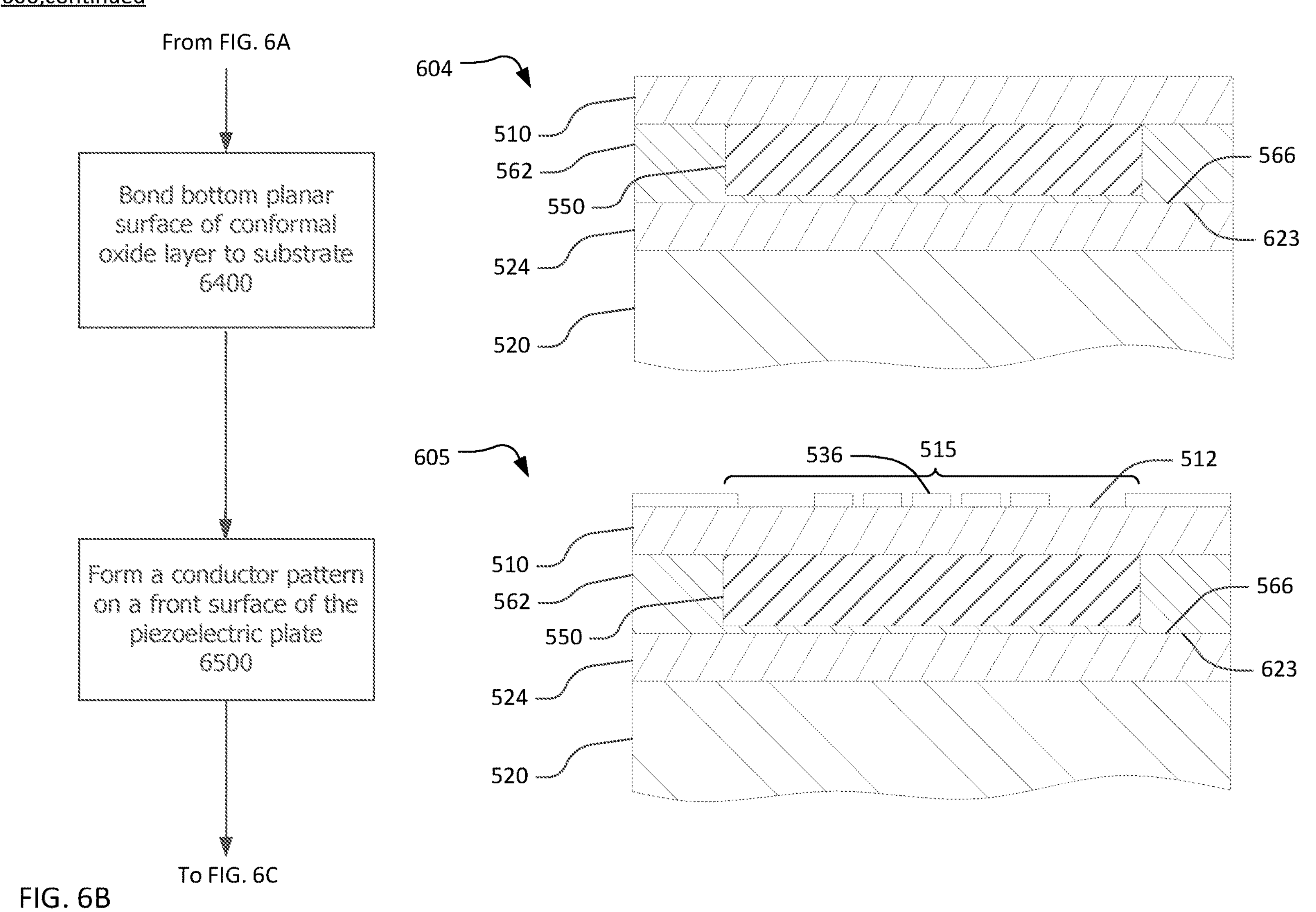
Figure 6C:
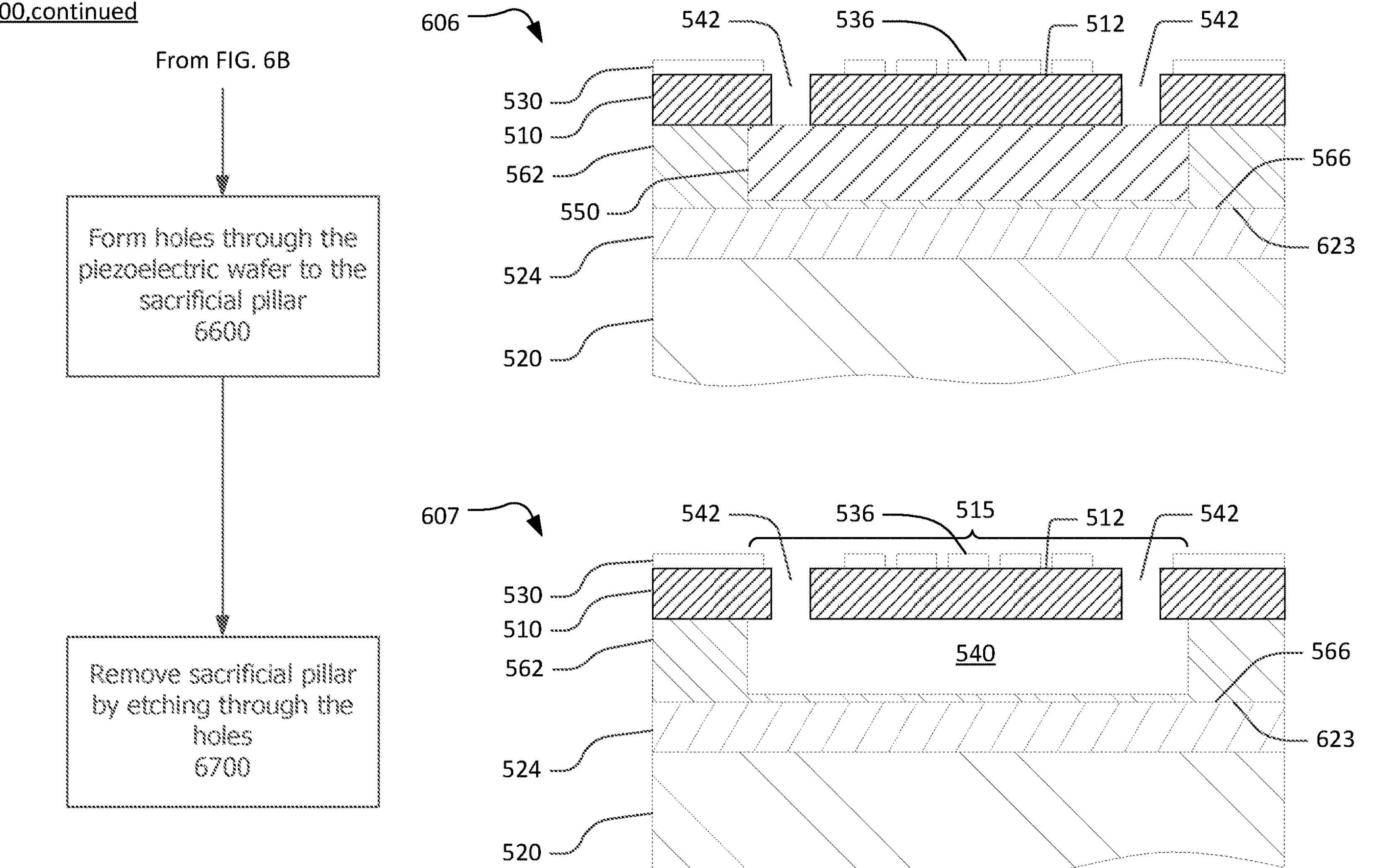

FIGS. 6A, 6B and 6C are a flow chart of a process 600 for fabricating an XBAR resonator using a sacrificial pillar on a piezoelectric plate and/or using a homogenous bonding surface. The process 600 may be the forming of or may be included in the forming of resonator 100 or 300. The process 600 starts at step 6100 and ends at step 6700 with a completed XBAR RF resonator 607. The flow chart of FIG. 6 may be similar to that of FIG. 5 with the exception of the changes from step 5400 to step 6400 and the changes from devices 504-507 to devices 604-607. The process 600 may be a resonator box free buildup process.

Steps 6100, 6200 and 6300 are performed similar to steps 5100, 5200 and 5300, respectively to form devices 501, 502 and 503, respectively.

At 6400, a bottom planar surface 566 of conformal dielectric layer 564 is bonded to a substrate 520 to form device 604. Step 6400 may be bonding the planar bottom surface 566 to a planar front or top surface 623 of the substrate wafer 520. Surface 623 is a surface of element 524 which is the trap-rich region of the substrate 520.

Bonding at 6400 may be flip chip bonding a wafer having device 603 to a wafer having substrate 520, such as by inverting the wafer having the plate 603 and bonding it upside down to the substrate wafer 520. At 6400, bonding may be flip chip bonding the planar surface 566 of the highly conforming dielectric layer to a trap rich layer 524 of or on the substrate wafer 520.

Bonding at 6400 may be forming a bond between surfaces 566 and 623 by an adhesive, chemical, covalent, atomic, and/or electron bond. Bonding at 6400 may be a bond at noted at 5400 but between the surfaces at 6400 instead of the surfaces at 5400. Bonding at 6400 may be an adhesive bond, direct or fusion bonding, such as including plasma or wet surface activation bond. The boning mechanism may be a combination of Van der Waals and covalent bonds.

Step 6400 may include, prior to bonding, forming the trap rich top layer 524 on (or as part of) the substrate wafer 520. Step 6400 may include, prior to forming the bonding, thinning the piezoelectric wafer to form a piezoelectric plate having a target piezoelectric membrane thickness. The plate or wafer may be referred to as either plate or wafer in further processing descriptions.

Steps 6500, 6600 and 6700 are performed similar to steps 5500, 5600 and 5700, respectively, to form devices 605, 606 and 607. Devices 605, 606 and 607 are the same as devices 506, 507 and 508, respectively, with the exception that devices 605, 606 and 607 do not have BOX layer 522 and the surface 566 of layer 562 is bonded to surface 623 of trap rich layer 524.

Process 600 and/or removing the sacrificial pillar at 6700 may be part of a FSMR process that provides a lower cost, more controllable approach for XBAR devices as compared to a technique without a pillar 550 on the plate 510, with a pillar formed directly on the substrate 520 or using a BSMR process. Process 600 and/or removing the sacrificial pillar at 6700 may provide a more accurate lateral etch and vertical cavity wall etch of the cavity 540 than not using pillar 550 formed on the plate 510 and/or not using conforming layer 560/562 over the pillar.

Process 600 and/or polishing the dielectric to leave thickness the of the dielectric 562 that covers the pillar at 6300 forms a homogenous surface 566 of the material of layer 562 for bonding to the substrate 520 or trap rich 524 of the substrate makes it easier to polish the highly conforming dielectric 560 as noted for process 500. Using the homogenous bonding surface 566 makes it easier to bond the highly conforming dielectric 562 to the substrate (e.g., layer 520 or 524) since only the material of layer 562 is being bonded to the substrate as noted for process 500.

Boding layer 562 directly to layer 524 instead of to layer 522 creates a resonator device 607 with reduced SiO2 under pad areas The reduced SiO2 under pad areas is beneficial because with reduced SiO2 under pad and metal routing areas, the reduced SiO2 thickness improves thermal resistance to silicon substrate for superior heat dissipation off of the resonator structure, such as into a package of the filter, which provides more margin for high power and temperature operation of the resonator.

Boding layer 562 directly to layer 524 instead of to layer 522 creates a resonator device 607 that may have concerns about doped glass of layer 562 in direct contact with trap rich layer 524. Phosphorous or Boron dopants may migrate into high resistivity substrate layer 524 or 520, reducing desired resistance of that substrate layer. In some cases, a thermal or undoped glass layer can be used as barrier between layer 562 and layer 524 to avoid this issue. In some cases, doped glass is not used for layer 562 to avoid this issue. In some cases, layer 562 is an undoped glass 562.

In some cases, for process 600, the substrate 520 is a high resistivity, a polycrystalline or a crystalline silicon (Si) material having a thickness of 150-500 um; the pillar 550 is polysilicon or amorphous silicon with a thickness of between 0.5 or 0.2 and 7 um thick; the conformal layer 562 is PSG and has a thickness of between 2 and 8 um thick; and the trap rich layer 524 is an oxide layer or trap rich polysilicon layer having a thickness of between 0.3 and 1 um; the IDT 530 is metal such as titanium aluminum; and the piezoelectric plate 510 is one of lithium niobate or lithium tantalate having a thickness of between 150 and 1000 nm.

In some cases, device 607 is an acoustic resonator having a piezoelectric plate 510, a portion of the piezoelectric plate spanning a cavity 540 in a conformal dielectric layer 562 bonded to a substrate 520. The dielectric layer 562 has a polished and homogenous bottom surface 566 of dielectric forming the bond to a planar surface 623 of a trap rich layer 524 of the substrate. An interdigital transducer 530 is on a surface of the piezoelectric plate 510, with interleaved fingers 536 of the IDT on the portion of the piezoelectric plate that spans the cavity. Holes 542 extend through the piezoelectric plate 510 to the cavity 540.

Figure 7A:
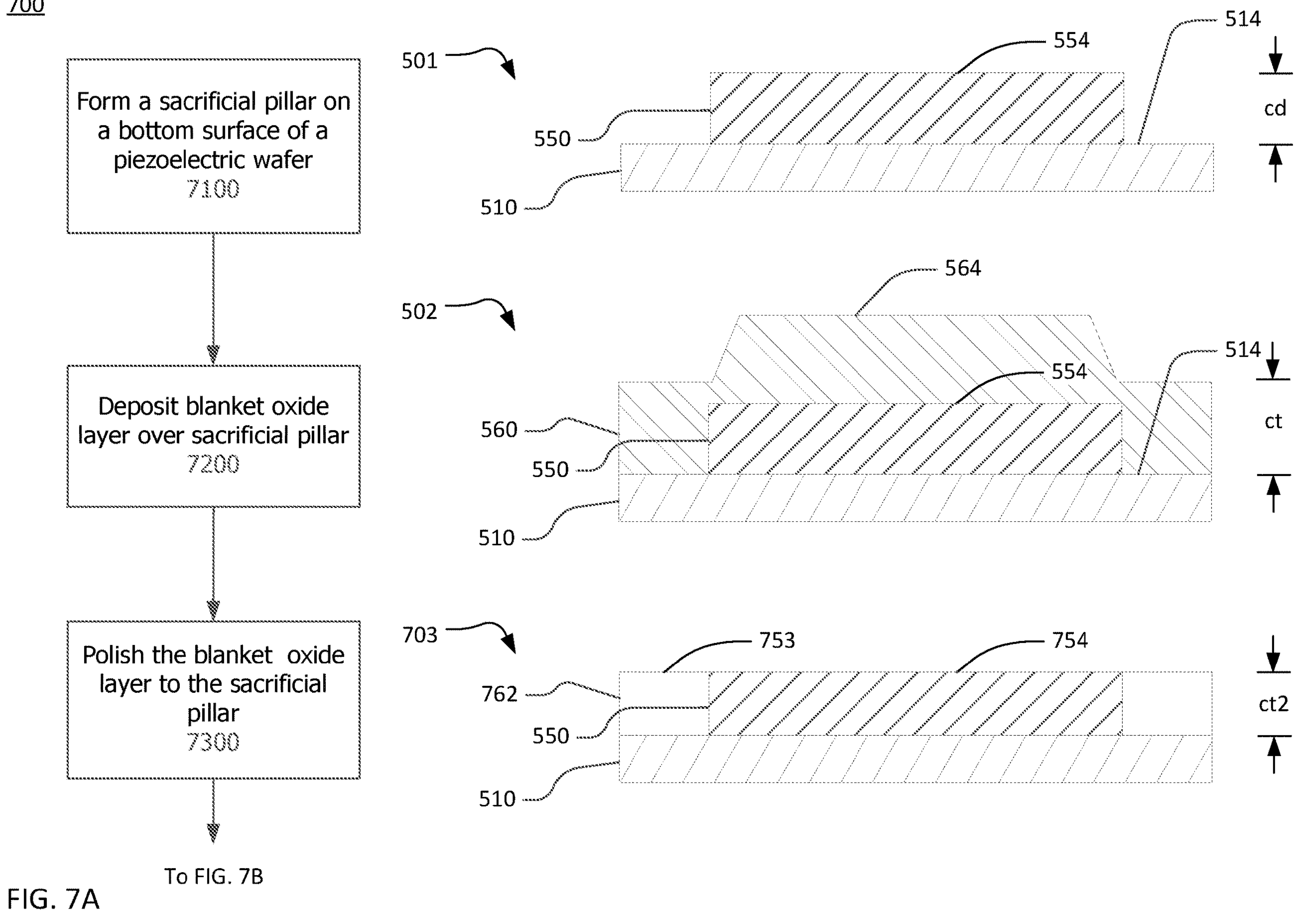
FIGS. 7A, 7B and 7C are a flow chart of a process for fabricating an XBAR resonator using a sacrificial pillar on a piezoelectric plate.
Figure 7B:
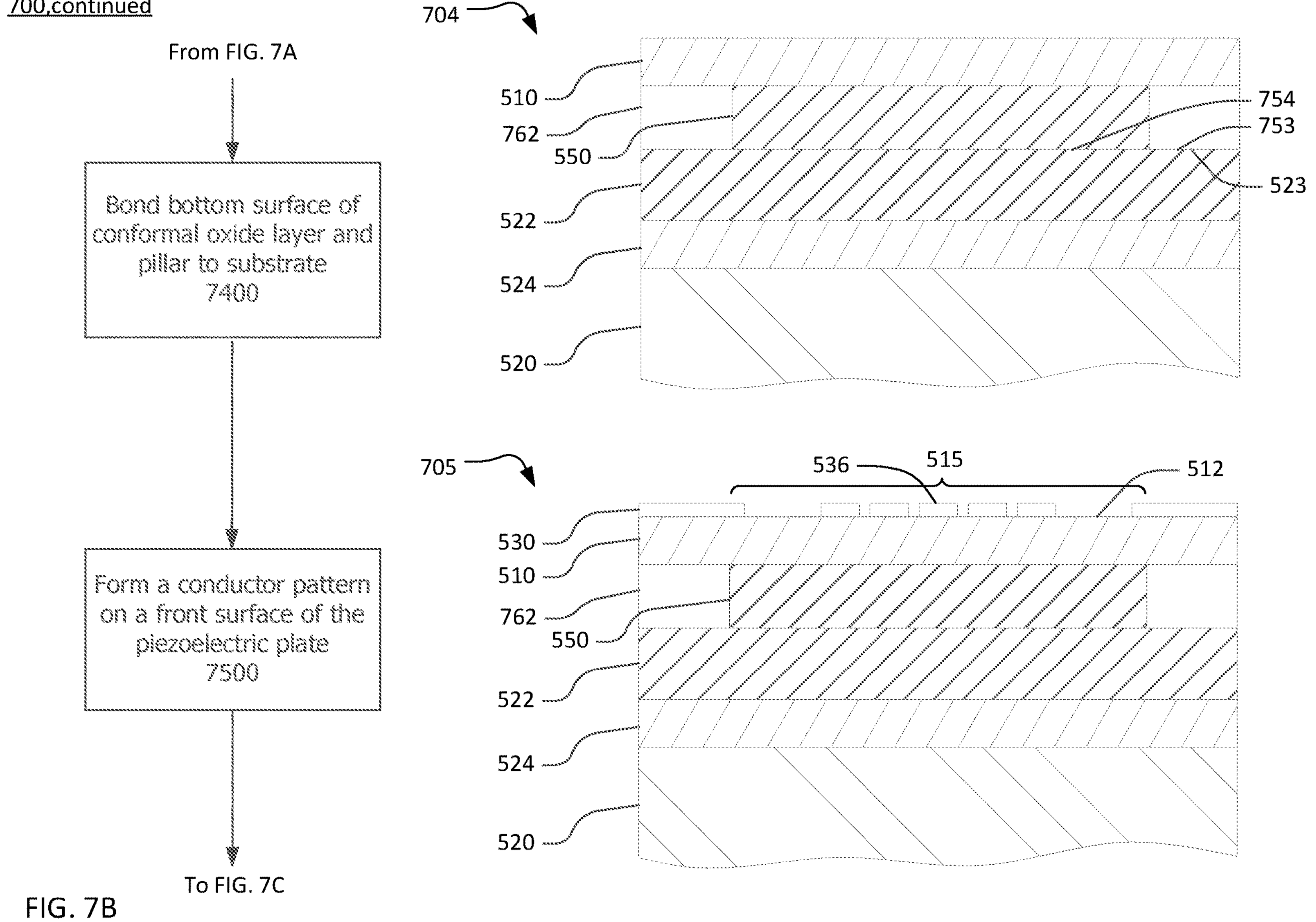
Figure 7C:
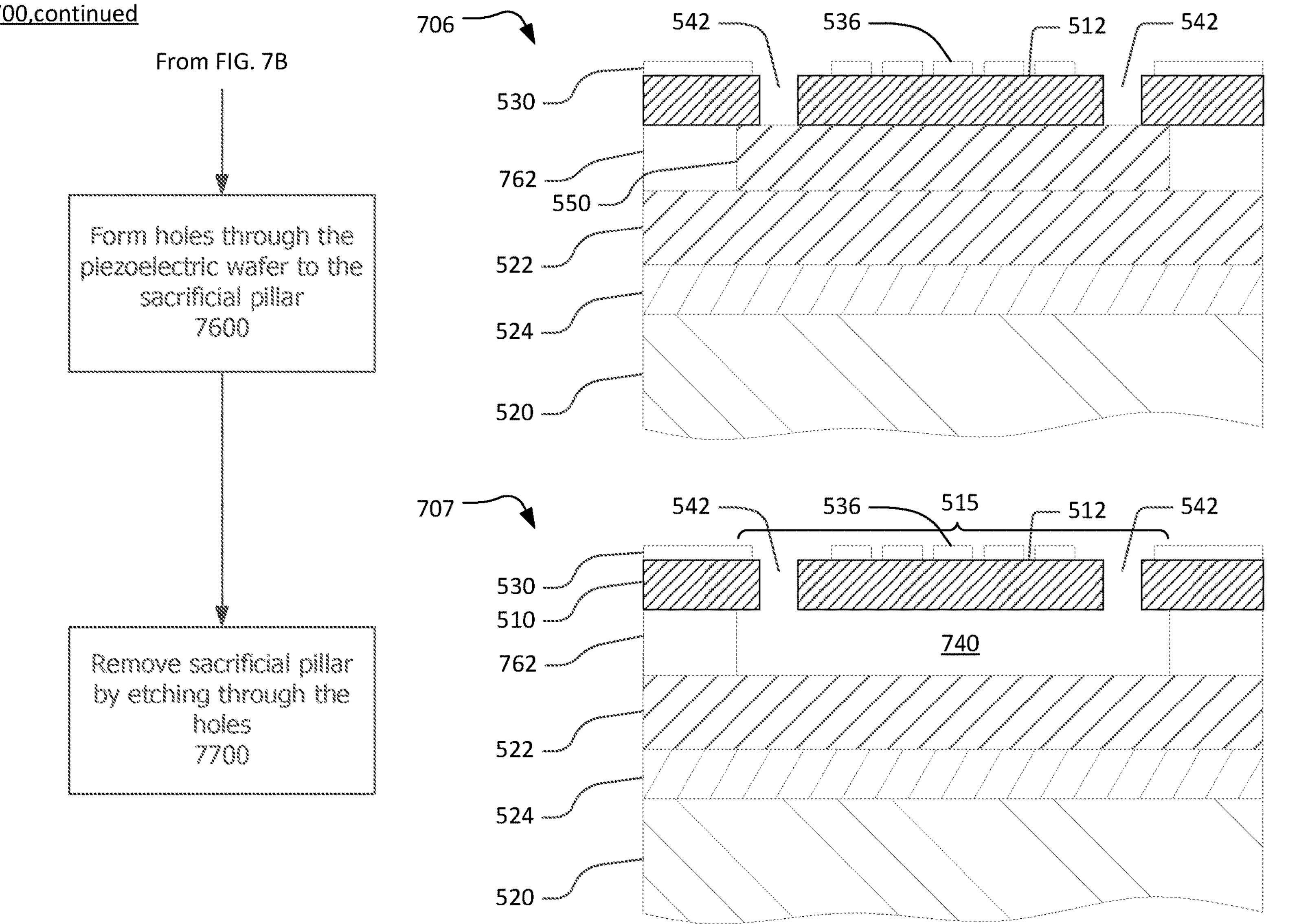

FIGS. 7A, 7B and 7C are a flow chart of a process 700 for fabricating an XBAR resonator using a sacrificial pillar on a piezoelectric plate. The process 700 may be the forming of or may be included in the forming of resonator 100 or 300. The process 700 starts at step 7100 and ends at step 7700 with a completed XBAR RF resonator 707. The flow chart of FIG. 7 may be similar to that of FIG. 5 with the exception of the changes from steps 5300, 5400 and 5700 to steps 7300, 7400 and 7700; and the changes from devices 503-507 to devices 703-707. The process 700 may be a resonator pillar full polish process.

Steps 7100 and 7200 are performed similar to steps 5100 and 5200, respectively to form devices 501 and 502, respectively. For process 700, layer 560 has a thickness ct above the surface 514 and over surface 554. Thickness ct is greater than thickness cd and may become a thickness ct2 less than or equal to thickness cd and forming a planar surface 754 after polishing surface 564 and/or thickness ct to thickness ct2 at step 7300.

At 7300, a blanket dielectric layer 560 is polished to or into pillar 550 to form device 703. Step 7300 may be polishing a bottom surface 564 of the blanket highly conforming dielectric layer 560 to form a bottom surface 753 of the highly conforming dielectric layer 762 and a bottom surface 754 of the of the pillar 550. Surfaces 753 and 754 may each be planar surfaces. They may or may not be in the same plane. Surfaces 753 and 754 may be non-homogenous surfaces for bonding to a substrate 520 or BOX layer 522 of a substrate.

Polishing at 7300 may be planarizing an exposed surface 754 by CMP or another process that polishes to expose or polishes into the pillar 550. The pillar thickness ct2 or the depth of cavity 740 (see step 7700), may be set by wafer level poshing control at step 7300. In this case, polishing at 7300 does not leave a thickness the of the blanket dielectric layer 560 over the pillar 550 as does stop 5300, but instead at 7300 the bottom surface 754 of pillar 550 is exposed.

At 7400, bottom surfaces 753 and 754 of conformal dielectric layer 762 and pillar 550 are bonded to a substrate 520 to form device 704. Step 7400 may be bonding the surfaces 753 and 754 to a planar front or top surface 523 of the substrate wafer 520. Bonding at 7400 may be flip chip bonding a wafer having device 703 to a wafer having substrate 520, such as by inverting the wafer having the plate 703 and bonding it upside down to the substrate wafer 520.

At 7400, bonding may be flip chip bonding the planar surfaces 753 and 754 of the highly conforming dielectric layer and pillar to a bonding oxide (BOX) layer 522 of the substrate, the BOX layer on a trap rich layer 524 of the substrate wafer 520.

Bonding at 7400 may be forming a bond between surfaces 753 and 754 and surface 523 by an adhesive, chemical, covalent, atomic, and/or electron bond. Bonding at 7400 may be a bond at noted at 5400 but between the surfaces at 7400 instead of the surfaces at 5400. Bonding at 7400 may be an adhesive bond, direct or fusion bonding, such as including plasma or wet surface activation bond. The boning mechanism may be a combination of Van der Waals and covalent bonds.

Steps 7500 and 7600 are performed similar to steps 5500 and 5600, respectively to form devices 705 and 706, respectively. Devices 705 and 706 are the same as devices 505 and 506, respectively, with the exception that devices 705 and 706 do not have thickness the of the layer 562 over the pillar but have surface 753 of the pillar bonded directly to and touching surface 523 of BOX layer 522.

At 7700, the sacrificial pillar 550 is removed by etching through the holes 542 to form device 707. Step 7700 may be removing the sacrificial pillar 550 using an etchant introduced through the holes 542 in the piezoelectric wafer 510 to form a cavity 740 under a diaphragm 515 of the piezoelectric wafer 510 spanning the cavity 740. Diaphragm 515 may be a portion of the piezoelectric plate 510 containing the IDT 530 and that spans the cavity 740.

Etching at 7700 may be etching the pillar 550 down to layer 522 so that the bottom of the cavity 740 is a surface of layer 522. Forming the cavity 740 at 7700 may use an etching process, such as etching away the pillar 550 material through the holes 542 using the material of plate 510, layer 762 and layer 522 as an etch stop for the etching to form the cavity 740.

Step 7700 may include removing pillar 550 using a front-side etching of the pillar 550 through the holes 542 to form the cavity 740 where the pillar 550 is removed in a FSMR of a piezoelectric membrane of the plate 510 to form the diaphragm 515 over the etched cavity 740.

In some cases, the sacrificial pillar 550 is a pillar material that can be selectively etched with respect to the material of the highly conforming dielectric layer 762, layer 522 and the material of the piezoelectric plate 510. In some cases, the sacrificial pillar 550 is a pillar material that can be selectively etched with respect to the material of plate 510.

When the plate 510 material is an LN or LT PZ layer, etch selectivity to LN or LT for the material of pillar 550 may be >10,000:1, such as where the etchant chemical is XeF2 or VHF. Other etchants in this case may be a wet etch of HF. Another etchant in this case may be SF6/KOH, and/or Phosphoric. Some examples include plate 510 being a PZ layer and the etch being:

| Sacrificial Material 550 or 850 | Etch Stop 562, 762 or 824 | Example Etchant |
|---|---|---|
| Si based (amorphous, polysilicon) | SiO2 | XeF2, SF6, KOH |
| SiO2 | Si | vapor HF, HF, BOE |
| Si | SiN | SF6, KOH |
| SiO2 | SiN | vapor HF, HF, BOE |
| Si, SiO2, Sin | Sapphire/Al203 layer | Any of these etchants above |
| SiN | Si or SiO2 | Phosphoric |

In some cases, the highly conforming dielectric layer is phosphosilicate glass (PSG) glass, Diamond, SiC, or AN; the sacrificial pillar is polycrystalline silicon or an amorphous Silicon; the bonding layer is SiO2; the at least one conductor pattern is metal; the piezoelectric plate is lithium niobate; and the etchant to remove the pillar is FS6.

Process 700 and/or removing the sacrificial pillar at 7700 may be part of a FSMR process that provides a lower cost, more controllable approach for XBAR devices as compared to technique without a pillar 550 on the plate 510, with a pillar formed directly on the substrate 520 or using a BSMR process. Process 700 and/or removing the sacrificial pillar at 7700 may be provide a more accurate lateral etch and vertical cavity wall etch of the cavity 740 than not using pillar 550 formed on the plate 510 and/or not using conforming layer 560/762 surrounding the pillar.

Process 700 and/or polishing the dielectric to the pillar at 5300 can form heterogenous surfaces 753 and 754 for bonding to the substrate 520 or oxide layer 522 of the substrate may make it more difficult than polishing the highly conforming dielectric 560 since the material of surfaces 753 and 754 are both being polished which may create inconsistent or non-uniform polishing when polishing the different materials of the highly conforming dielectric 560 and sacrificial pillar material 550. In other words, polishing to pillar 550 may not form a planar surface (e.g., such as surface 566 of only layer 562) but by also polishing pillar 550, may create inconsistencies in the polished planar surfaces 753 and 754.

Using the heterogenous surfaces 753 and 754 may make it more difficult to bond the highly conforming dielectric 762 and pillar 550 to the substrate (e.g., layer 520 or 522) since the material of both heterogenous surfaces 753 and 754 (e.g., as compared to just of layer 562) are being bonded to the substrate which may cause inconsistent or non-uniform bonding, such as compared to just bonding a single material to the substrate. Using the heterogenous bonding surfaces 753 and 754 can allow good bonding to the substrate 520 or layer 524 with or without a substrate oxide layer 522 to bond to the plate wafer.

In some cases, for process 700, the substrate 520 is a high resistivity, a polycrystalline or a crystalline silicon (Si) material having a thickness of 150-500 um; the pillar 550 is polysilicon and has a thickness of between 0.2 and 7 um thick; the conformal layer 762 is PSG and has a thickness of between 0.2 and 7 um thick; the BOX layer 522 has a thickness of between 3 and 5 um; and the trap rich layer 524 is an oxide layer or trap rich polysilicon layer having a thickness of between 0.3 and 1 um; the IDT 530 is metal such as titanium aluminum; and the piezoelectric plate 510 is one of lithium niobate or lithium tantalate having a thickness of between 150 and 1000 nm.

In some cases, device 707 is an acoustic resonator having a piezoelectric plate 510, a portion of the piezoelectric plate spanning a cavity 740 in a conformal dielectric layer 762 bonded to a substrate 520. The dielectric layer 762 has a polished bottom surface 753 and the pillar has a polished bottom surface 754, where both surfaces form the bond to a planar surface 523 of a bonding oxide (BOX) layer 522 of the substrate. An interdigital transducer 530 is on a surface of the piezoelectric plate 510, with interleaved fingers 536 of the IDT on the portion of the piezoelectric plate that spans the cavity. Holes 542 extend through the piezoelectric plate 510 to the cavity 740. For process 700, the pillar thickness ct2 or the depth of cavity 740, may be set by wafer level poshing control at step 7300.

Figure 8A:
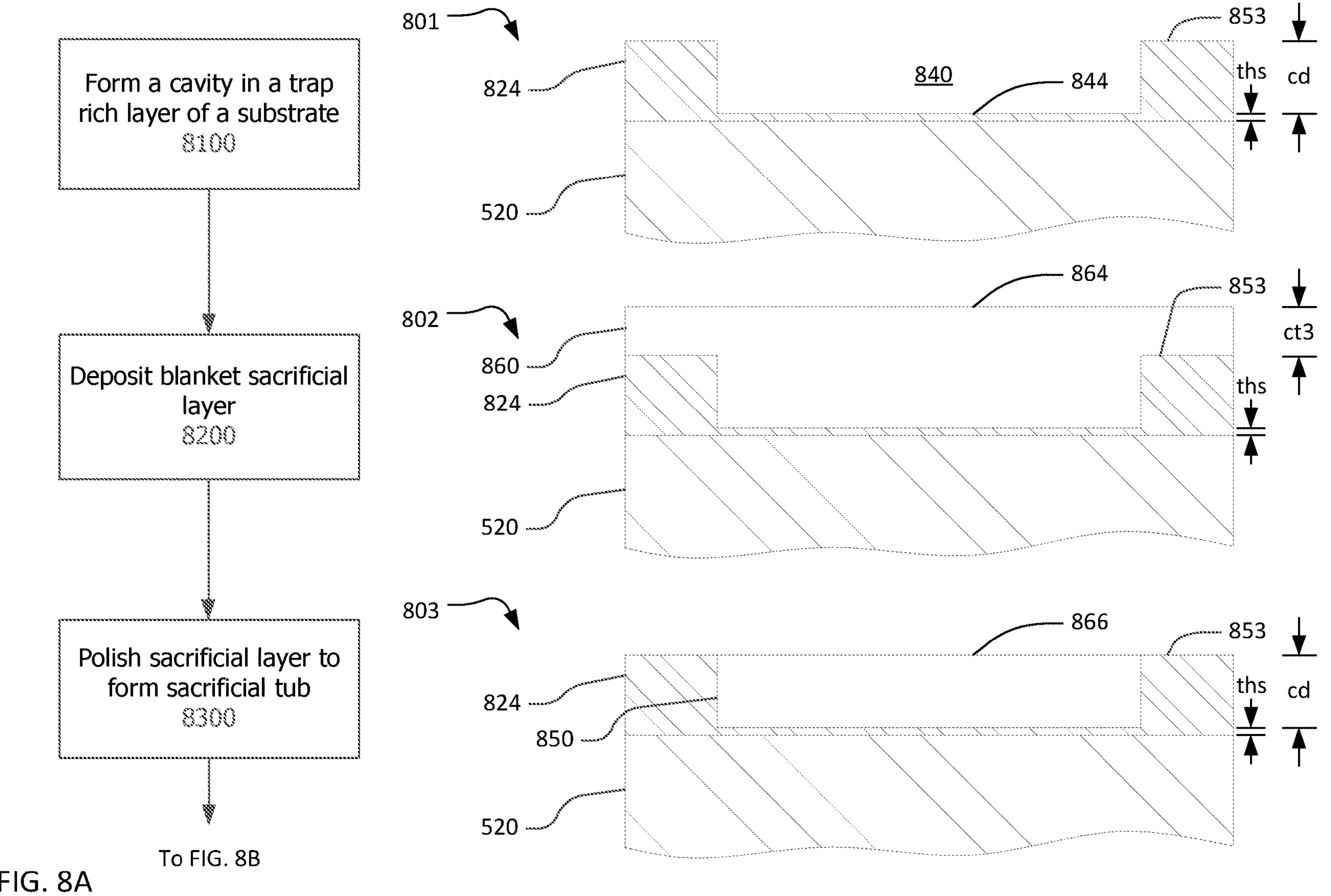
FIGS. 8A, 8B and 8C are a flow chart of a process for fabricating an XBAR resonator using a sacrificial tub in a trap rich layer.
Figure 8B:
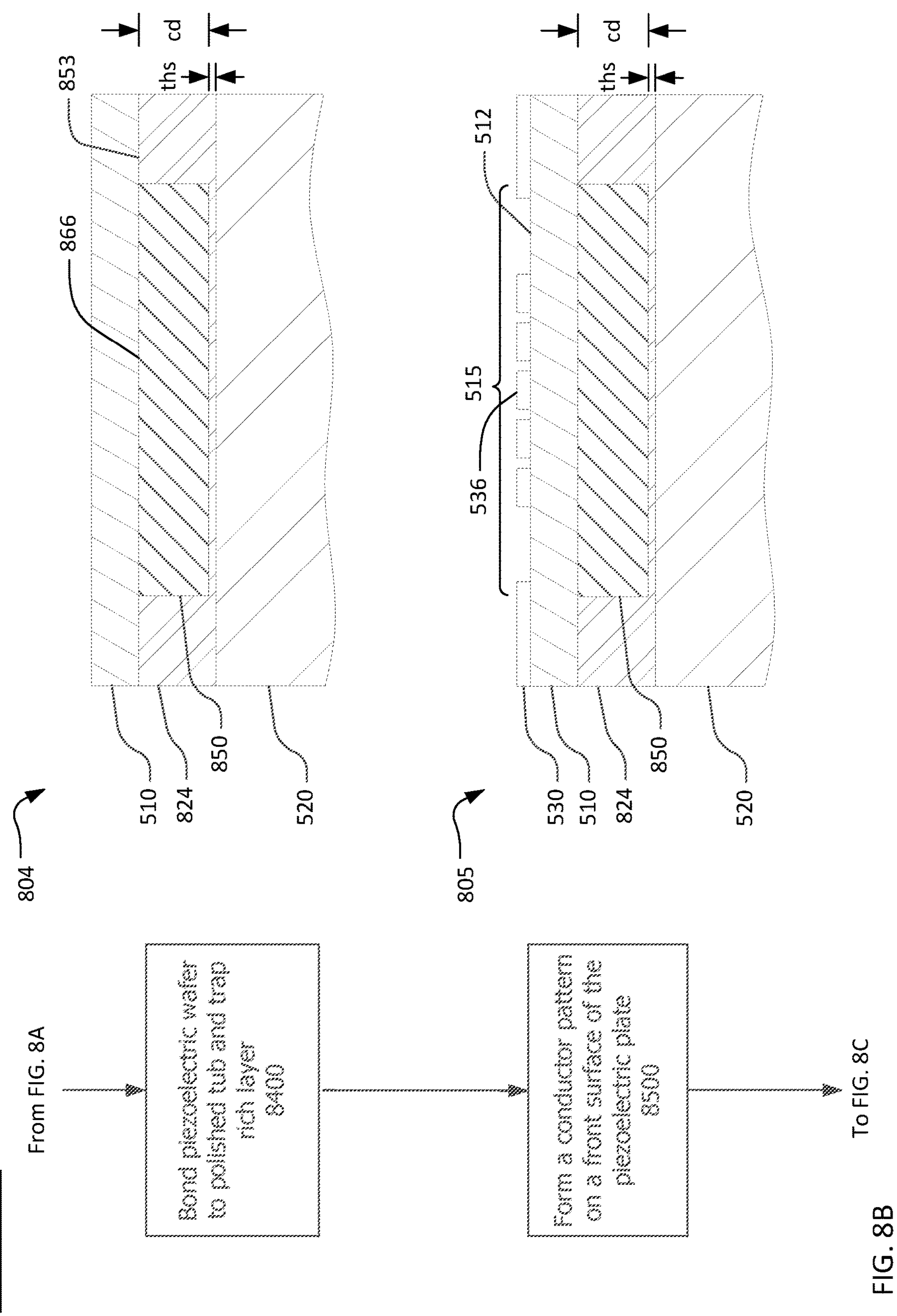
Figure 8C:
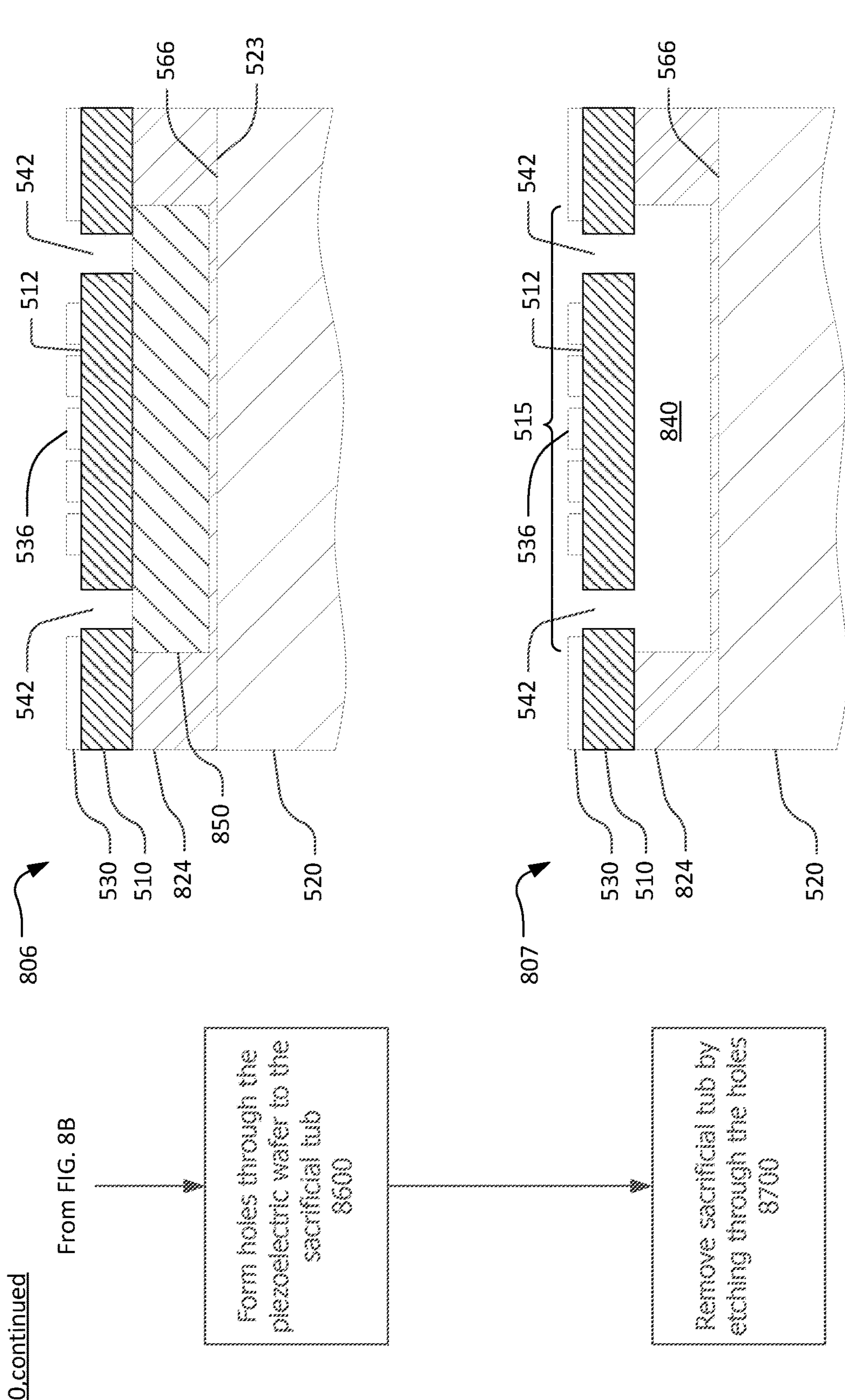

FIGS. 8A, 8B and 8C are a flow chart of a process 800 for fabricating an XBAR resonator using a sacrificial tub in a trap rich layer. The process 800 may be the forming of or may be included in the forming of resonator 100 or 300. The process 800 starts at step 8100 and ends at step 8700 with a completed XBAR RF resonator 807. The process 800 may be a resonator shallow trench isolation (STI), box free, buildup process.

At 8100, a cavity 840 is formed in trap rich layer 824 of substrate 520 to form device 801. Cavity 840 has a depth cd from layer 824 top surface 853 to a bottom surface 844 of the cavity within layer 824. Depth cd may be a depth for a cavity of an XBAR, such as for cavity 140 or 340.

Step 8100 may include forming the cavity 840 by depositing a blanket layer of trap rich material on the top surface 853 of the substrate 520; then optionally polishing the trap rich material; then masking and patterning the top of the blanket layer of (polished) material; and etching through the pattern to remove areas of the blanket layer material to the depth cd, such as using a timed etch, to leave cavity 840. At 8100, forming cavity 840 leaves a thickness the of the trap rich layer 824 that covers the substrate 520 under the cavity 840.

At 8200, a blanket sacrificial layer 860 is formed in the cavity 840 and over a top surface 853 of the layer 824 to form device 802. The material of sacrificial layer 860 may be the same as that of pillar 550.

At 8300, the blanket sacrificial layer 860 is polished to or into sacrificial tub 850 to form device 803. At 8300, the blanket sacrificial layer 860 is polished and a thickness cd of a sacrificial tub 850 from blanket sacrificial layer 860 is left in cavity 840. Step 8300 may be polishing a top surface 864 of the blanket layer 860 to form a top surface 866 of the sacrificial tub 850. Step 8300 may be polishing a top surface 864 of the blanket layer 860 to or to form a top surface 866 of the sacrificial tub 850. Surfaces 853 and 866 may each be planar surfaces. They may or may not be in the same plane.

Surfaces 853 and 866 may be non-homogenous surfaces for bonding to a piezoelectric wafer 510 or piezoelectric plate.

Polishing at 8300 may be planarizing a top exposed surface 864 by CMP or another process that polishes to expose or polishes into the surface 853. The tub thickness cd or the depth of cavity 840 (see step 8700), may be set by wafer level poshing control at step 8300.

At 8400, a piezoelectric plate or wafer 5100 is bonded to layer 824 and tub 850 to form device 804. Step 8400 may be bonding a planarized bottom surface of plate 510 to polished top surfaces 853 and 866. Bonding at 8400 may be forming a bond between a bottom surface of plate 510 and top surfaces 853 and 866 by an adhesive, chemical, covalent, atomic, and/or electron bond. Bonding at 8400 may be an adhesive bond, direct or fusion bonding, such as including plasma or wet surface activation bond. The boning mechanism may be a combination of Van der Waals and covalent bonds.

Step 8400 may include, prior to or after forming the bond, thinning the piezoelectric wafer to form a piezoelectric plate having a target piezoelectric membrane thickness. The plate or wafer may be referred to as either plate or wafer in further processing descriptions.

In some cases, a BOX layer 522 is formed between the plate 510 and the top surfaces 853 and 866.

Steps 8500 and 8600 are performed similar to steps 5500 and 5600, respectively, to form devices 805 and 806. Devices 805 and 806 are the same as devices 505 and 506, respectively, with at least the exceptions that devices 805 and 806 have a sacrificial tub 850 within layer 824 instead of sacrificial pillar 550 within conforming layer 562; and do not have BOX layer 522.

At 8700, the sacrificial tub 850 is removed by etching through the holes 542 to form device 807. Step 8700 may be removing the sacrificial tub 850 using an etchant introduced through the holes 542 in the piezoelectric wafer 510 to form a cavity 840 under a diaphragm 515 of the piezoelectric wafer 510 spanning the cavity 840. Diaphragm 515 may be a portion of the piezoelectric plate 510 containing the IDT 530 and that spans the cavity 840.

Forming the cavity 840 at 8700 may use an etching process, such as etching away the tub 850 material through the holes 542 using the material of plate 510 and layer 824 as an etch stop for the etching to form the cavity 840.

Step 8700 may include removing tub 850 using a front-side etching of the tub 850 through the holes 542 to form the cavity 840 where the tub 850 is removed in a FSMR of a piezoelectric membrane of the plate 510 to form the diaphragm 515 over the etched cavity 840.

In some cases, the sacrificial tub 850 is a tub material that can be selectively etched with respect to the material of the plate 510 and layer 824. In some cases, the sacrificial tube 850 is a tube material that can be selectively etched with respect to the material of plate 510.

When the plate 510 material is an LN or LT PZ layer, etch selectivity to LN or LT for the material of tub 850 may be >10,000:1, such as where the etchant chemical is XeF2 or VHF. Other etchants in this case may be a wet etch of HF. Another etchant in this case may be SF6/KOH, and/or Phosphoric. Some examples include plate 510 being a PZ layer and the etch being:

| Sacrificial Material 550 or 850 | Etch Stop 562, 762 or 824 | Example Etchant |
|---|---|---|
| Si based (amorphous, polysilicon) | SiO2 | XeF2, SF6, KOH |
| SiO2 | Si | vapor HF, HF, BOE |
| Si | SiN | SF6, KOH |
| SiO2 | SiN | vapor HF, HF, BOE |
| Si, SiO2, Sin | Sapphire/Al203 layer | Any of these etchants above |
| SiN | Si or SiO2 | Phosphoric |

In some cases, the highly conforming dielectric layer is phosphosilicate glass (PSG) glass, Diamond, SiC, or AN; the sacrificial pillar is polycrystalline silicon or an amorphous Silicon; the bonding layer is SiO2; the at least one conductor pattern is metal; the piezoelectric plate is lithium niobate; and the etchant to remove the pillar is FS6.

Process 800 and/or removing the sacrificial tub at 8700 may be part of a FSMR process that provides a lower cost, more controllable approach for XBAR devices as compared to a technique without a tub 850 in the trap rich layer 824, with a pillar formed directly on the substrate 520 or using a BSMR process. Process 800 and/or removing the sacrificial tub at 8700 may provide a more accurate lateral etch and vertical cavity wall etch of the cavity 840 than not using tub 850 formed in the layer 824.

Using the sacrificial tub 850 in layer 824 instead of a pillar 550 in layer 562 creates a resonator device 807 with a very forgiving (SiO2 of tub 850 material in Si of layer 824 material) etch selectivity to form the cavity 840 at 8700.

Forming layer 860 directly onto layer 824 instead of onto a BOX layer creates a resonator device 807 that may have concerns about doped glass of layer 860 in direct contact with trap rich layer 824. Phosphorous or Boron dopants may migrate into high resistivity substrate layer 824 or 520, reducing desired resistance of that substrate layer. In some cases, a thermal or undoped glass layer can be used as barrier between layer 860 and layer 824 to avoid this issue. In some cases, doped glass is not used for layer 860 to avoid this issue.

Process 800 and/or polishing the layer 860 to form the tub at 8300 can form heterogenous surfaces 853 and 866 for bonding to the plate 510 may make it more difficult than polishing the highly conforming dielectric 560 since the material of surfaces 853 and 866 are both being polished which may create inconsistent or non-uniform polishing when polishing the different materials of the surfaces 853 and 866. In other words, polishing to form tub 850 may not form a planar surface (e.g., such as surface 566 of only layer 562) but by also polishing tub 850, may create inconsistencies in the polished planar surfaces 853 and 866.

Using the heterogenous surfaces 853 and 866 may make it more difficult to bond the layer 824 and tub 850 to plate 510 since the material of both heterogenous surfaces 853 and 866 (e.g., as compared to just of layer 562) are being bonded to the plate which may cause inconsistent or non-uniform bonding, such as compared to just bonding a single material to the plate. Using the heterogenous bonding surfaces 853 and 866 can allow good bonding to the plate 510 with or without a substrate oxide layer 522 to bond to the plate wafer.

In some cases, for process 800, the substrate 520 is a high resistivity, a polycrystalline or a crystalline silicon (Si) material having a thickness of 150-500 um; the tub 850 is an oxide such as a silicon oxide and has a thickness of between 0.2 and 7 um thick; the trap rich layer 824 is a silicon and/or trap rich polysilicon layer has a thickness of between 2 and 8 um thick; the IDT 530 is metal such as titanium aluminum; and the piezoelectric plate 510 is one of lithium niobate or lithium tantalate having a thickness of between 150 and 1000 nm.

In some cases, device 807 is an acoustic resonator having a piezoelectric plate 510, a portion of the piezoelectric plate spanning a cavity 840 in a trap rich layer 824 bonded to a substrate 520. The trap rich layer 824 has a polished and homogenous bottom surface of material forming the bond to a planar surface of a substrate 520. An interdigital transducer 530 is on a surface of the piezoelectric plate 510, with interleaved fingers 536 of the IDT on the portion of the piezoelectric plate that spans the cavity 840. Holes 542 extend through the piezoelectric plate 510 to the cavity 840.

Figure 9A:
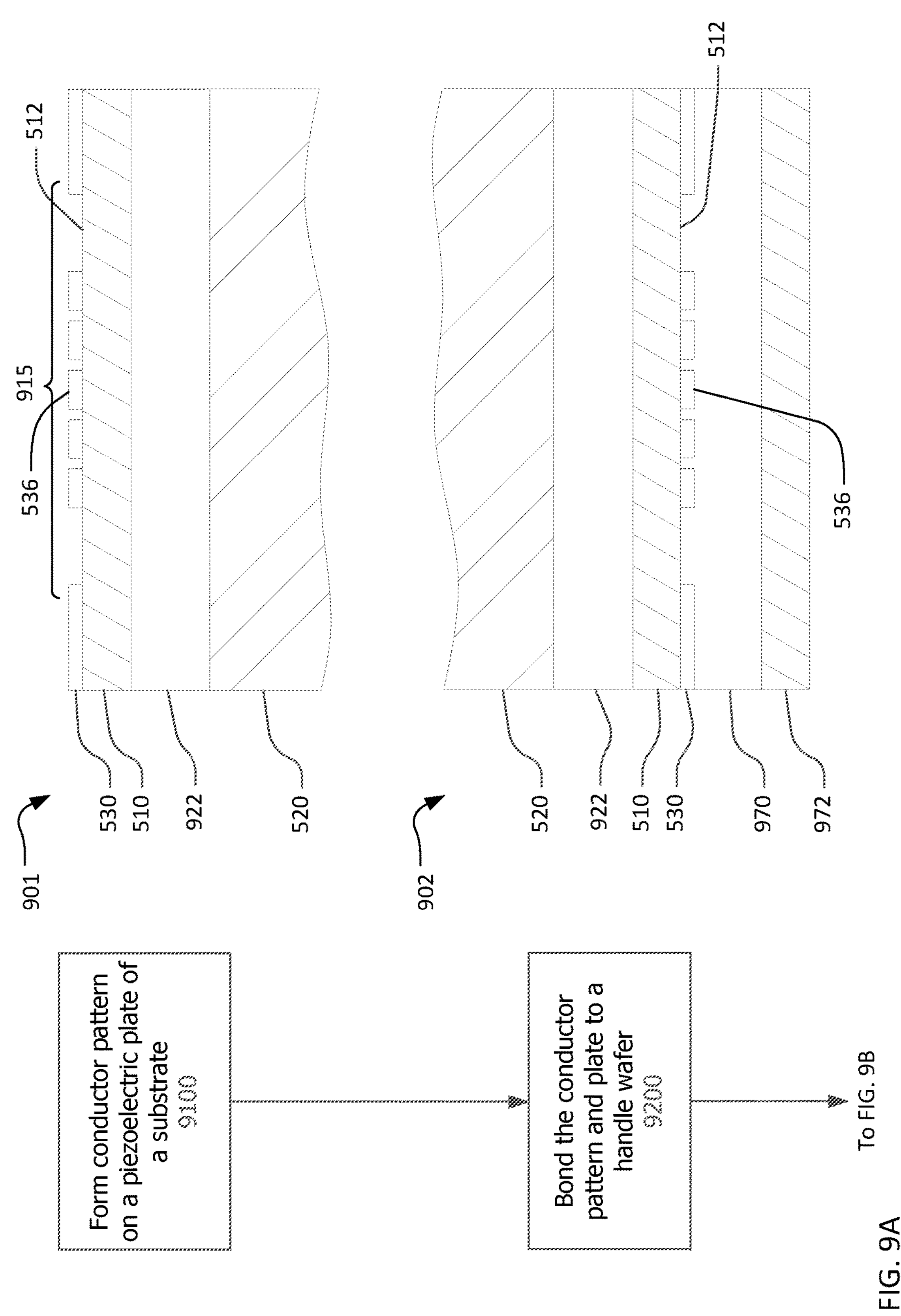
FIGS. 9A, 9B and 9C are a flow chart of a process for fabricating an XBAR resonator using temporary handle wafer.
Figure 9B:
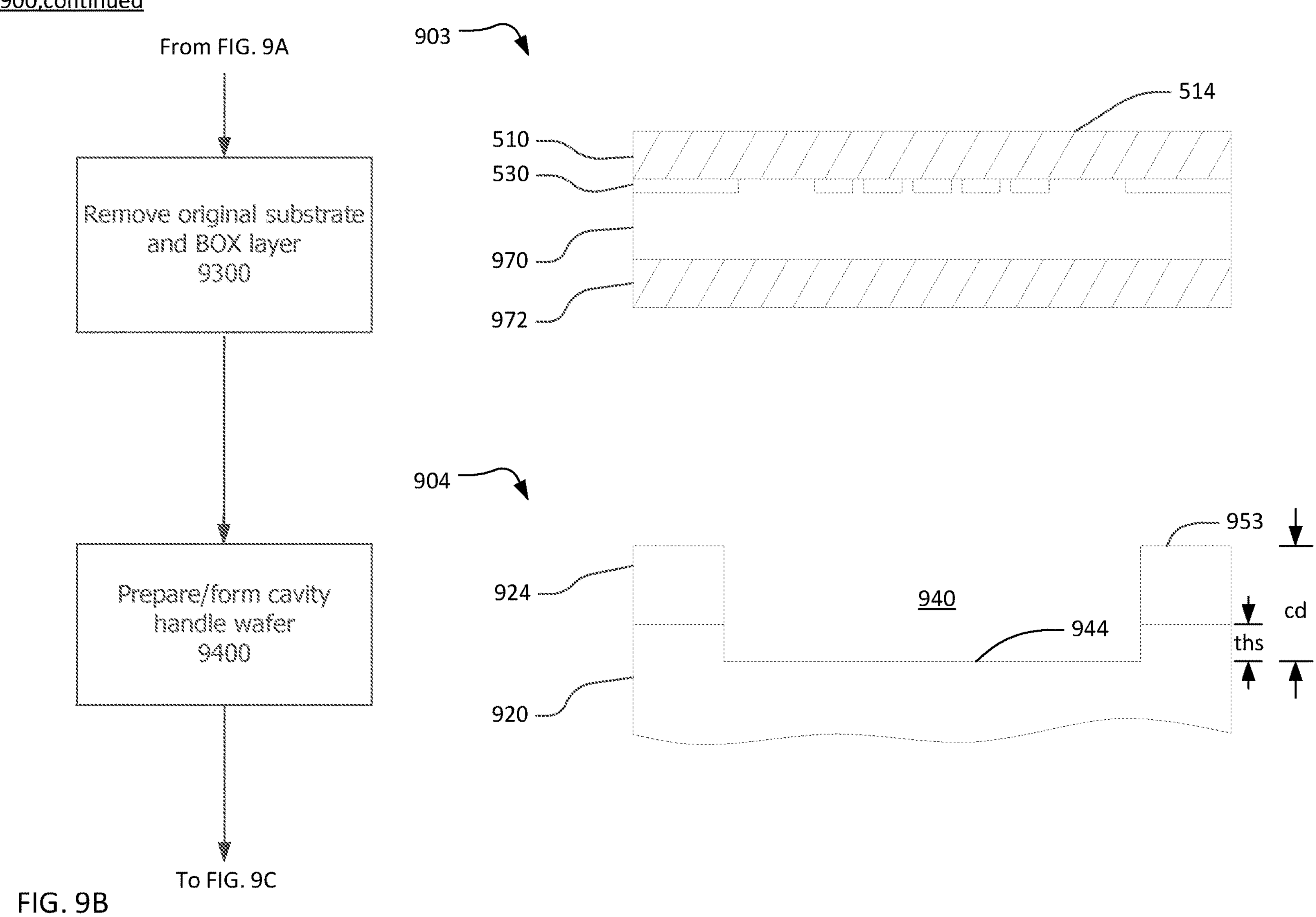
Figure 9C:
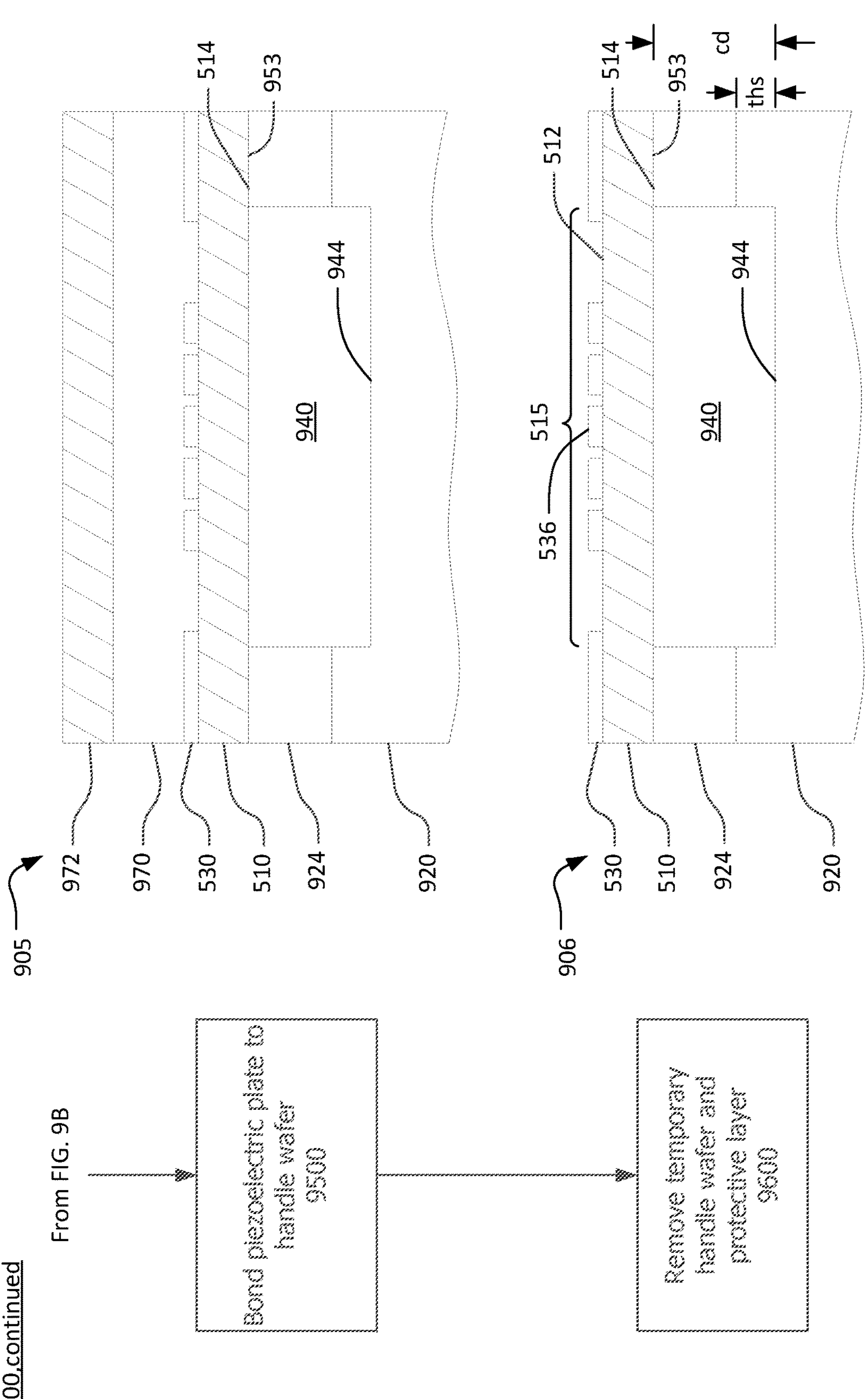

FIGS. 9A, 9B and 9C are a flow chart of a process 900 for fabricating an XBAR resonator using temporary handle wafer 972. The process 900 may be the forming of or may be included in the forming of resonator 100 or 300. The process 900 starts at step 9100 and ends at step 9600 with a completed XBAR RF resonator 906. The process 900 may be a dual layer transfer process.

At 9100, a conductor pattern having an IDT 530 is formed on a piezoelectric plate 510 of an oxide layer 922 which is on top of a substrate 520 to form device 901. The conductor pattern and IDT 530 may be as noted for IDT 130 or 330. Plate 510 is plate 110 or 310. IDT 530 is formed on top surface 512 of plate 510, has fingers 536 on that surface and a location 915 for a diaphragm over a cavity 940 (e.g., of step 9600). Location for a diaphragm 915 is a location for diaphragm 515, such as over a cavity 940. The oxide layer 922 may be similar to oxide layer 522 or it may be a thicker version that is the same material and 1.1 to 3.0 time as thick as layer 522.

At 9200, the conductor pattern having IDT 530 and plate 510 are bonded to protective layer 970 formed on a handle wafer 972 to form device 902. Bonding at 9200 may be bonding top surface 512 and IDT 530 to the layer 970. Bonding at 9200 may be an adhesive bond, direct or fusion bonding, such as including plasma or wet surface activation bond. The boning mechanism may be a combination of Van der Waals and covalent bonds.

The protective layer 970 may be a polymeric material, bonding wax, or that like. It may have a thickness range of between 0.5 um (e.g., at least enough thickness to cover the topology of the metal of IDT 530) and 25 um. The protective layer 970 may have a high enough strength to support subsequent processes of steps 9300-9600; and the ability be removable by being thermally sensitive, light sensitive or mechanically peelable with respect to device 905.

The handle wafer 972 may be a typical substrate material such as silicon, sapphire, quartz, glass, Diamond, SiC, or AlN. It may have a thickness of between 100 nm and 1 mm that is sufficient to provide mechanical stability for steps 9300-9600, such as for a 2" to 4" radius wafer.

At 9300, original substrate 520 and BOX layer 920 are removed from the bottom of plate 510 to form device 903. The substrate 520 and BOX layer 920 may be removed by a thermal process, dry etch or wet etch such. The etch may be an etch of substrate 520 and then of layer 970. It may etch layer 970 and then 520. It may be an etch of layer 970 float off wafer 520. One option here is to (i) backgrind the Silicon substrate 520 most of the way off, (ii) dry etch any remaining Si 520 and/or some SiO2 layer 970, (iii) final short wet etch to remove final SiO2 970 and be a selective etch to LN. Step 9300 exposes bottom surface 512 of the plate 510.

At 9400, a cavity handle wafer is prepared or formed to form device 904. Step 9400 may be removing cavity 940 in a cavity area of the top surface 953 of trap rich layer 924 and into substrate 920 to form cavity 940. Cavity 940 may be a cavity as described for cavities herein, including cavity 140 or 340. Trap rich layer 924 may be a trap rich layer as describe for layer 524 except layer 924 has cavity 940 through layer 924, Substrate 920 may be a substrate as describe for substrate 520 except substrate 920 has cavity 940 extending a depth ths into substrate 920. Cavity 940 extends a depth cd for an XBAR cavity through layer 924 and into substrate 920.

Layer 924 has a top surface 953 that may be a polished and/or planar surface formed before or after forming cavity 940. At 9400, cavity 940 extends a depth ths from top surface 953 of layer 924 to a bottom surface 944 the substrate 920.

Step 9400 may include forming the cavity 940 by masking and patterning the top surface 953 of the layer 924 of (polished) material; and etching through the pattern to remove areas of the layer 924 and part of the thickness of substrate 920 material to the depth cd, such as using a timed etch, to leave cavity 940. Etching cavity 940 through layer 924 may use substrate 920 as an etch stop. Etching cavity 940 depth ths into substrate 920 may be set by wafer level etching or a timed etch.

At 9500 piezoelectric plate 510 is bonded to layer 924 of handle wafer 920 to form device 905. Bonding at 9500 may be bonding a bottom surface 514 of plate 510 of device 903 to a top surface 953 of layer 924 of device 904. At 9500 cavity 904 extends depth cd from a bottom surface 514 of plate 510 to a bottom surface 944 of the cavity in substrate 920.

Bonding at 9500 may be flip chip bonding a wafer having device 903 to a wafer having substrate 920, such as by inverting the wafer having the plate 510 and bonding it upside down to the substrate wafer 920. At 9500, bonding may be flip chip bonding the planar surfaces 514 of the wafer 510 to a planarized surface 953 of the trap rich layer 924 having cavity 940, At 9600, temporary handle wafer 972 and protective layer 970 are removed from plate 510 and the conductor pattern having IDT 530 to form device 906. Step 9600 may include selectively etching layer 970 with respect to layer 510 and IDT 530. Step 9600 exposes the top surface 514 and IDT 530. Step 9600 may include removing wafer 972 and protective layer 970 from the top surface 512 and IDT 530 by a thermal process, dry etch or wet etch such as a temporary bonding technique.

Layer 970 may be a temporary bonding layer to offer mechanical support for thin or to-be-thinned wafers 510 and 920.

Layer 970 may be an adhesives classified by its debonding mechanism (weakening the adhesive bond between the device and carrier wafer), which is based on laser, mechanical force or temperature. Slide-off and lift-off debonding may mark the starting point of temporary bonding for removing layer 970. Mechanical or UV-laser-initiated debonding may be used separately or be combined in the debonding process.

Using process 900 and/or layer 970 may eliminate the need for LN hole etching of holes 342 through plate 510 providing a stronger plate and harder to damage plate when used; provide access to a backside of the LN membrane to perform other processing steps if needed, such as LN etching or additional structure patterning; and allow LN thickness setting and IDT processing to be performed on ‘blanket’ POI wafer 903 and 905, rather than on patterned substrates that can complicate these processes.

In some cases, for process 900, the substrate 520 is a high resistivity, a polycrystalline or a crystalline silicon (Si) material having a thickness of 150-500 um; the trap rich layer 924 is an oxide layer or trap rich polysilicon layer having a thickness of between 0.3 and 1 urn; the IDT 530 is metal such as titanium aluminum; and the piezoelectric plate 510 is one of lithium niobate or lithium tantalate having a thickness of between 150 and 1000 nm.

In some cases, device 907 is an acoustic resonator having a piezoelectric plate 510, a portion of the piezoelectric plate spanning a cavity 940 through a trap rich layer 762 bonded to a substrate 520 and a depth the into the substrate. The layer 924 has a polished top surface 953 bonded to a polished bottom surface 514 of plate 510. An interdigital transducer 530 is on a surface of the piezoelectric plate 510, with interleaved fingers 536 of the IDT on the portion of the piezoelectric plate that spans the cavity 940. Holes (e.g., holes 542) do not extend through the piezoelectric plate 510 to the cavity 940 because they are not needed in process 900 as the cavity is formed prior to bonding at 9500. For process 900, the cavity thickness cd or the depth of cavity 940 may be set by wafer level etching at step 9400.

Although the description herein relate to an XBAR filter, the same concepts can be applied to a filter that each of one, some or all of the XBARs with a surface acoustic wave resonator (SAW), a bulk acoustic wave (BAW) resonator, a film bulk acoustic wave (FBAW) resonator, a temperature compensated surface acoustic wave resonator (TC-SAW), or a solidly-mounted transversely-excited film bulk acoustic resonator (SM-XBAR).

CLOSING COMMENTS

Throughout this description, the embodiments and examples shown should be considered as exemplars, rather than limitations on the apparatus and procedures disclosed or claimed. Although many of the examples presented herein involve specific combinations of method acts or system elements, it should be understood that those acts and those elements may be combined in other ways to accomplish the same objectives. With regard to flowcharts, additional and fewer steps may be taken, and the steps as shown may be combined or further refined to achieve the methods described herein. Acts, elements and features discussed only in connection with one embodiment are not intended to be excluded from a similar role in other embodiments.

As used herein, "plurality" means two or more. As used herein, a "set" of items may include one or more of such items. As used herein, whether in the written description or the claims, the terms "comprising", "including", "carrying", "having", "containing", "involving", and the like are to be understood to be open-ended, i.e., to mean including but not limited to. Only the transitional phrases "consisting of" and "consisting essentially of", respectively, are closed or semi-closed transitional phrases with respect to claims. Use of ordinal terms such as "first", "second", "third", etc., in the claims to modify a claim element does not by itself connote any priority, precedence, or order of one claim element over another or the temporal order in which acts of a method are performed, but are used merely as labels to distinguish one claim element having a certain name from another element having a same name (but for use of the ordinal term) to distinguish the claim elements. As used herein, "and/or" means that the listed items are alternatives, but the alternatives also include any combination of the listed items.

It is claimed:

1. A method of fabricating an acoustic resonator using sacrificial pillars, the method comprising:

forming a sacrificial pillar on a bottom surface of a piezoelectric wafer;

depositing a blanket conforming dielectric layer on the bottom surface of the piezoelectric wafer and on the sacrificial pillar to cover the sacrificial pillar;

polishing a bottom surface of the blanket conforming dielectric layer to form a bottom planar surface of the blanket conforming dielectric layer and to leave a thickness of the blanket conforming dielectric that covers the sacrificial pillar;

bonding the planar bottom surface of the blanket conforming dielectric layer to a front surface of a substrate wafer;

forming at least one conductor pattern on a planar front surface of the piezoelectric wafer;

forming holes through the piezoelectric wafer to the sacrificial pillar; and removing the sacrificial pillar using an etchant introduced through the holes in the piezoelectric wafer to form a cavity under a diaphragm of the piezoelectric wafer spanning the cavity, wherein forming the sacrificial pillar includes:

depositing a blanket layer of pillar material on the bottom surface of the piezoelectric wafer;

masking and patterning a top of the blanket layer of pillar material;

etching through a resulting pattern of the blanket layer to remove areas of the blanket layer of pillar material to the piezoelectric wafer to leave the sacrificial pillar; and using the piezoelectric wafer as an etch stop for the etching through the pattern to remove areas of the blanket layer of pillar material.

2. The method of claim 1, wherein the bonding comprises flip chip bonding the planar surface of the blanket conforming dielectric layer to a bonding oxide (BOX) layer of the substrate that is on a trap rich layer of the substrate wafer.

3. The method of claim 2, further comprising, prior to the bonding:

forming the trap rich layer on the substrate wafer; and forming the BOX layer on the trap rich layer.

4. The method of claim 1, wherein the sacrificial pillar is a pillar material configured to be selectively etched with respect to a material of the blanket conforming dielectric layer and a material of the piezoelectric wafer.

5. The method of claim 1, wherein;

a thickness of the blanket conforming dielectric is between 1 nm and 10 μm; and a thickness of the sacrificial pillar is between 0.2 nm and 7 μm.

6. The method of claim 1, wherein the removing of the sacrificial pillar includes front-side etching the sacrificial pillar through the holes in the piezoelectric wafer to form the cavity where the sacrificial pillar is removed in a frontside release of a piezoelectric membrane of the piezoelectric wafer to form the diaphragm over an etched cavity under the diaphragm.

7. The method of claim 1, wherein the forming of the at least one conductor pattern includes forming an interdigital transducer (IDT) with interleaved fingers disposed on the diaphragm spanning the cavity; and wherein the piezoelectric wafer forms a piezoelectric plate that with the IDT are configured such that radio frequency signals applied to the IDT excites a primary shear acoustic mode in the piezoelectric plate over the cavity.

8. The method of claim 1, wherein the polishing of the blanket conforming dielectric layer leaves a thickness of the dielectric layer that covers the sacrificial pillar so that the dielectric layer has a homogenous surface for bonding to the substrate wafer or an oxide layer of the substrate wafer.

9. A method of fabricating an acoustic resonator, the method comprising:

depositing a blanket layer of a pillar material on a piezoelectric layer;

masking and patterning a top of the blanket layer of pillar material;

etching through the patterned top of the blanket layer of pillar material to remove areas of the blanket layer of pillar material to leave a pillar of the pillar material;

depositing a blanket dielectric layer to cover the pillar;

planarizing a surface of the dielectric layer;

polishing a bottom surface of the planarized dielectric layer to form a bottom planar surface of the dielectric layer and to leave a thickness of the dielectric layer that covers the pillar;

flip-chip bonding the planarized surface of the dielectric layer to a bonding oxide (BOX) layer of a substrate that is on a trap rich layer of the substrate;

forming a conductor pattern on the piezoelectric layer; and removing the pillar through holes in the piezoelectric layer to form a cavity where the pillar was removed.

10. The method of claim 9, wherein the removing of the pillar includes front-side etching the pillar through the holes in the piezoelectric layer to form the cavity where the pillar is removed, to frontside release a piezoelectric membrane of the piezoelectric layer to form a diaphragm over the etched cavity that spans the cavity.

11. The method of claim 10, wherein the conductor pattern includes an interdigital transducer (IDT) with interleaved fingers disposed on the diaphragm spanning the cavity.

12. The method of claim 11, wherein the piezoelectric layer and the IDT are configured such that radio frequency signals applied to the IDT excite a primary shear acoustic mode in the piezoelectric layer over the cavity, wherein a thickness of the diaphragm is selected to tune the primary shear acoustic modes in the piezoelectric layer.

13. The method of claim 9, further comprising, prior to the bonding:

forming the trap rich layer on the substrate; and forming the BOX layer on the trap rich layer.

14. The method of claim 13, wherein the substrate is a polycrystalline or crystalline silicon (Si) material having a thickness of 250-500 μm;

the pillar is polysilicon and has a thickness between 1 and 5 μm;

the BOX layer has a thickness between 3 and 5 μm; and the trap rich layer is an oxide layer having a thickness between 1 and 5 μm; and the piezoelectric layer is one of lithium niobate or lithium tantalate having a thickness between 150 and 1000 nm.

15. A method of fabricating an acoustic resonator using sacrificial pillars, the method comprising:

forming a sacrificial pillar on a bottom surface of a piezoelectric wafer;

depositing a blanket conforming dielectric layer on the bottom surface of the piezoelectric wafer and on the sacrificial pillar to cover the sacrificial pillar;

polishing a bottom surface of the blanket conforming dielectric layer to form a bottom planar surface of the blanket conforming dielectric layer and to leave a thickness of the blanket conforming dielectric that covers the sacrificial pillar;

bonding the planar bottom surface of the blanket conforming dielectric layer to a front surface of a substrate wafer;

forming at least one conductor pattern on a planar front surface of the piezoelectric wafer;

forming holes through the piezoelectric wafer to the sacrificial pillar; and removing the sacrificial pillar using an etchant introduced through the holes in the piezoelectric wafer to form a cavity under a diaphragm of the piezoelectric wafer spanning the cavity, wherein:

the piezoelectric wafer is one of lithium niobate or lithium tantalate;

the sacrificial pillar is one of polycrystalline silicon, an amorphous silicon, a silicon oxide, or a silicon nitride;

the blanket conforming dielectric layer is one of phosphosilicate glass (PSG), silicon oxide borosilicate glass (BSG), silicon oxide borophosphosilicate glass (BPSG), silicon oxide spin on glass (SOG), undoped silicon oxide, or silicon nitride;

the BOX layer is one of polycrystalline silicon, silicon oxide or silicon nitride; and the substrate wafer is one of silicon, sapphire or quartz.

* * * * *